US012050997B2

(12) United States Patent
Tsai et al.

(10) Patent No.: US 12,050,997 B2
(45) Date of Patent: Jul. 30, 2024

(54) ROW-BY-ROW CONVOLUTIONAL NEURAL NETWORK MAPPING FOR ANALOG ARTIFICIAL INTELLIGENCE NETWORK TRAINING

(71) Applicant: INTERNATIONAL BUSINESS MACHINES CORPORATION, Armonk, NY (US)

(72) Inventors: Hsinyu Tsai, San Jose, CA (US); Geoffrey Burr, Cupertino, CA (US); Pritish Narayanan, San Jose, CA (US); Malte Johannes Rasch, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 1100 days.

(21) Appl. No.: 16/884,130

(22) Filed: May 27, 2020

(65) Prior Publication Data

US 2021/0374546 A1 Dec. 2, 2021

(51) Int. Cl.
*G06N 3/084* (2023.01)
*G11C 7/10* (2006.01)
(Continued)

(52) U.S. Cl.
CPC ........... *G06N 3/084* (2013.01); *G11C 7/1006* (2013.01); *G11C 11/54* (2013.01);
(Continued)

(58) Field of Classification Search
CPC ........ G06N 3/045; G06N 3/048; G06N 3/063; G06N 3/065; G06N 3/084; G11C 11/54;
(Continued)

(56) References Cited

U.S. PATENT DOCUMENTS 6,876,989 B2   4/2005  Shi
9,779,355 B1  10/2017  Leobandung
(Continued)

OTHER PUBLICATIONS

Deng et al., "SemiMap: A Semi-Folded Convolution Mapping for Speed-Overhead Balance on Crossbars", Jan. 2020, IEEE Transactions on Computer-Aided Design of Integrated Circuits and Systems, vol. 39, No. 1, pp. 117-130. (Year: 2020).*

(Continued)

*Primary Examiner* — Brent Johnston Hoover
(74) *Attorney, Agent, or Firm* — CANTOR COLBURN LLP; Daniel Yeates

(57) ABSTRACT

A computer implemented method for implementing a convolutional neural network (CNN) using a crosspoint array includes configuring the crosspoint array to implement a convolution layer by storing one or more weights in crosspoint devices of the array. The method further includes making multiple copies of the weights and training the CNN. Training the CNN includes mapping input data of the convolution layer to the crosspoint array in a row-by-row manner. Further the excitation is input in a row-by-row manner into the crosspoint array, thereby creating row-by-row forward output from the crosspoint array. Further, outputs from the crosspoint devices are stored to corresponding integrators. Errors in the outputs as compared to a desired output, from multiple rows are computed and back propagated in a row-by-row manner into the crosspoint array, the computed errors transmitted to a previous convolution layer.

29 Claims, 20 Drawing Sheets

(51) Int. Cl.
  *G11C 11/54* (2006.01)
  *G11C 13/00* (2006.01)
  *G06N 3/063* (2023.01)
(52) U.S. Cl.
  CPC .......... *G11C 13/0069* (2013.01); *G06N 3/063* (2013.01); *G11C 2213/77* (2013.01); *G11C 2213/79* (2013.01)
(58) Field of Classification Search
  CPC ............ G11C 13/0069; G11C 2213/77; G11C 2213/79; G11C 7/1006
  See application file for complete search history.

(56) References Cited

U.S. PATENT DOCUMENTS

| | | | |
|---|---|---|---|
| 10,319,441 | B2 | 6/2019 | Ge |
| 10,346,347 | B2 | 7/2019 | Lu |
| 2018/0075338 | A1 | 3/2018 | Gokmen |
| 2018/0357533 | A1 | 12/2018 | Inoue |
| 2019/0065943 | A1 | 2/2019 | Cantin |
| 2019/0114544 | A1 | 4/2019 | Sundaram |
| 2019/0122105 | A1 | 4/2019 | Kara |
| 2019/0147342 | A1 | 5/2019 | Goulding |
| 2019/0188569 | A1 | 6/2019 | Naumov |
| 2019/0188572 | A1 | 6/2019 | Lanctot |
| 2020/0117986 | A1* | 4/2020 | Burr .......................... G06F 17/18 |
| 2020/0301605 | A1* | 9/2020 | Ramesh ............... G11C 7/1006 |

OTHER PUBLICATIONS

Narayanan et al., "Toward on-chip acceleration of the backpropagation algorithm using nonvolatile memory", Sep. 8, 2017, IBM Journal of Research and Development, vol. 61, Issue: 4/5, pp. 11:1-11:11. (Year: 2017).*

Lee et al.; "Adaptive Precision CNN Accelerator Using Radix-X Parallel Connected Memristor Crossbars", arXiv:1906.09395, Jun. 2019. 12 pages.

"Mixed-precision training of deep neural networks using computational memory," S. R. Nandakumar, et al., arXiv:1712.01192, 2017. pp. 1-9.

Esser et al., "Convolutional networks for fast, energy-efficient neuromorphic computing," Proceedings of the National Academy of Sciences, Oct. 2016, 113 (41); pp. 11441-11446; DOI: 10.1073/pnas.1604850113.

Gokmen, et al. "Training deep convolutional neural networks with resistive cross-point devices," Frontiers in Neuroscience vol. 11, 2017, Article 538, 25 pp.

Nandakumar et al., "Mixed-precision architecture based on computational memory for training deep neural networks," 2018 IEEE International Symposium on Circuits and Systems (ISCAS), May 2018, pp. 1-5. doi: 10.1109/ISCAS.2018.8351656.

Song et al., "Pipelayer: A Pipelined ReRAM-Based Accelerator for Deep Learning," 2017 IEEE International Symposium on High Performance Computer Architecture (HPCA), IEEE, 2017, 12 pages.

* cited by examiner f(x) = f (Input 1 * Connection Strength 1 + Input 2 * Connection Strength 2)

ROW-BY-ROW CONVOLUTIONAL NEURAL NETWORK MAPPING FOR ANALOG ARTIFICIAL INTELLIGENCE NETWORK TRAINING

BACKGROUND

The present invention relates in general to computing technology, and more particularly, to artificial neural networks (ANN). More specifically, embodiments of the present invention relate to mapping a convolutional neural network (CNN) to crosspoint devices in crosspoint arrays, such as in analog-memory-based hardware for training the CNN.

Technical problems such as character recognition and image recognition by a computer are known to be well handled by machine-learning techniques. "Machine learning" is used to broadly describe a primary function of electronic systems that learn from data. In machine learning and cognitive science, neural networks are a family of statistical learning models inspired by the biological neural networks of animals, and in particular the brain. Neural networks can be used to estimate or approximate systems and functions that depend on a large number of inputs and are generally unknown. Neural networks use a class of algorithms based on a concept of interconnected "neurons." In a typical neural network, neurons have a given activation function that operates on the inputs. By determining proper connection weights (a process also referred to as "training"), a neural network achieves efficient recognition of the desired patterns, such as images and characters. Oftentimes, these neurons are grouped into "layers" in order to make connections between groups more obvious and to organize the computation process. With these proper connection weights, other patterns of interest that have never been seen by the network during training can also be correctly recognized, a process known as "Forward Inference."

SUMMARY

According to one or more embodiments of the present invention, a computer implemented method for implementing a convolutional neural network (CNN) using a crosspoint array includes configuring the crosspoint array, the crosspoint array corresponding to a convolution layer in the CNN, by storing one or more weights in crosspoint devices of the crosspoint array. The method further includes training the CNN. Training the CNN includes mapping input data of the convolution layer into the crosspoint array in a row-by-row manner. Training the CNN further includes inputting excitation data in a row-by-row manner into the crosspoint array, thereby creating row-by-row forward output from the crosspoint array. Training the CNN further includes computing outputs from the crosspoint devices and storing the outputs in corresponding integrators. Training the CNN further includes computing errors in the outputs as compared to desired outputs, wherein the errors correspond to multiple rows. Training the CNN further includes back propagating the computed errors in a row-by-row manner into the crosspoint array, the computed errors transmitted to a previous convolution layer.

In one or more embodiments of the present invention, the integrators include capacitors. Further, in one or more embodiments of the present invention, an output electric current is generated by a crosspoint device that is at an intersection of a first row wire and a first column wire of the crosspoint array, and an integrator corresponds to a second column wire of the crosspoint array.

Training the CNN further includes updating the copies of the weights, wherein updating the copies of the weights includes updating each weight sequentially. In one or more embodiments of the present invention, updating the copies of the weights can include fixing a subset of the weights to zero.

Further, in one or more embodiments of the present invention, updating the copies of the weights includes digitizing both, the forward input and the errors that are back propagated. Further, an update is computed, the value of the update being accumulated over multiple excitations. Further, an analog update event is triggered to the crosspoint array, in response to a threshold of the update being exceeded.

In one or more embodiments of the present invention, the crosspoint devices are arranged so as to implement one or more rows of the convolution kernels of a given layer of the CNN, and wherein the input data represents neuron excitations to the said layer of the CNN presented one column at a time.

In one or more embodiments of the present invention, the crosspoint devices are memory cells each of which include 3 transistors and 1 capacitor.

One or more embodiments of the present invention include an electronic circuit for performing computations of a trained convolutional neural network (CNN). The electronic circuit includes a crosspoint array, and an output circuit that includes one or more integrators. The CNN is trained using the method described herein.

According to one or more embodiments of the present invention, a system includes a controller, and a crossbar system coupled with the controller. The crossbar system performs computations of a trained convolutional neural network (CNN). The crossbar system includes a crosspoint array, and an output circuit that includes one or more integrators. The CNN is trained using the method described herein.

According to one or more embodiments of the present invention, computer-implemented method for implementing a convolutional neural network (CNN) using a crosspoint array is described. The method includes configuring the crosspoint array, the crosspoint array corresponding to a first convolution layer in the CNN, by storing one or more weights in crosspoint devices of the crosspoint array. The method further includes training the CNN. The training includes mapping input data of the first convolution layer into the crosspoint array in a row-by-row manner. The training further includes performing forward propagation, which includes computing outputs from the crosspoint devices and storing the outputs in corresponding integrators. The forward propagation further includes sending the outputs to a second convolution layer of the CNN, the second convolution layer being sequentially after the first convolution layer in the CNN. The training further includes performing backward propagation, which includes computing errors in the outputs as compared to desired outputs. The backward propagation further includes back propagating the computed errors in a row-by-row manner into the crosspoint array, the computed errors transmitted to a third convolution layer of the CNN, the third convolution layer being sequentially prior to the first convolution layer. The training of the CNN further includes performing weight update, which includes receiving back propagated computed errors from the second convolution layer. The weight update further includes adjusting the weights stored in the crosspoint devices using the computed errors from the second convolution layer.

It is to be understood that the technical solutions are not limited in application to the details of construction and the arrangements of the components set forth in the following description or illustrated in the drawings. The technical solutions are capable of embodiments in addition to those described and of being practiced and carried out in various ways. Also, it is to be understood that the phraseology and terminology employed herein, as well as the abstract, are for the purpose of description and should not be regarded as limiting. As such, those skilled in the art will appreciate that the conception upon which this disclosure is based may readily be utilized as a basis for the designing of other structures, methods, and systems for carrying out the several purposes of the presently described technical solutions.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

DETAILED DESCRIPTION

Figure 1:
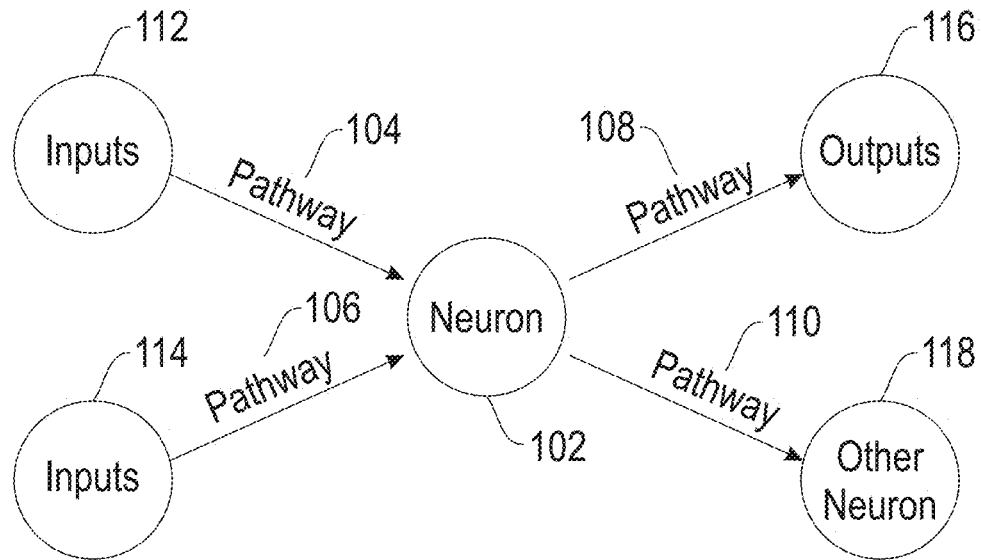
FIG. 1 depicts a simplified diagram of input and output connections of a mathematical neuron.

The technical solutions described herein facilitate efficient implementation of deep learning techniques that use convolutional neural networks. Deep learning techniques are widely used in machine-based pattern recognition problems, such as image and speech recognition. Deep learning inherently leverages the availability of massive training datasets (that are enhanced with the use of Big Data) and compute power (that is expected to grow according to Moore's Law).

Embodiments of the present invention facilitate efficient workload mapping of convolutional neural networks (CNNs) into analog arrays when implementing an analog artificial intelligence system, such as an artificial neural network (ANN) using crosspoint arrays. Existing techniques describe a "row-by-row" mapping of weights for CNN inference workload, so that activations through each layer of the CNN are efficiently used and streamlined to limit storage requirements. However, a technical challenge exists during training of such CNNs, where backward propagation and weight updates are also performed. These phases, the backward propagation and weight update, are not required during inference of such CNNs. Typically, when implementing CNNs using crosspoint arrays, allocation of weights in the crosspoint array is not changed so as to avoid Von-Neumann bottleneck, which is a well-known technical problem in which a limitation on throughput of the CNN is caused by the Von Neumann architecture that is used by most modern computer processors. Allocation of weights indicates assigning a particular crosspoint device in the crosspoint array to represent a particular weight in the CNN. It should be noted that the value "assigned" to the weight can be updated during the training phase of the CNN, although the "allocation" is not changed.

Embodiments of the present invention address such technical challenges during training of an ANN, particularly, a CNN, by providing a row-by-row mapping to be used for training workload with addition in peripheral circuits for such back/reverse propagation. The addition in peripheral circuits can be negligible in view of the gain in efficiency. Embodiments of the present invention can be used for several scenarios for weight update, including but not limited to, in situ updated, zeroing followed by periodic synchronization of weights, and mixed precision updates.

It is understood in advance that although one or more embodiments are described in the context of biological neural networks with a specific emphasis on modeling brain structures and functions, implementation of the teachings recited herein are not limited to modeling a particular environment. Rather, embodiments of the present invention are capable of modeling any type of environment, including for example, weather patterns, arbitrary data collected from the Internet, and the like, as long as the various inputs to the environment can be turned into a vector.

ANNs are often embodied as so-called "neuromorphic" systems of interconnected processor elements that act as simulated "neurons" and exchange "messages" between each other in the form of electronic signals. Similar to the so-called "plasticity" of synaptic neurotransmitter connections that carry messages between biological neurons, the connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition is defined by a set of input neurons which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read.

Crossbar arrays, also known as crosspoint arrays, crosswire arrays, or resistive processing unit (RPU) arrays, are high density, low cost circuit architectures used to form a variety of electronic circuits and devices, including ANN architectures, neuromorphic microchips and ultra-high density nonvolatile memory. A basic crosspoint array configuration includes a set of conductive row wires and a set of conductive column wires formed to intersect the set of conductive row wires. The intersections between the two sets of wires are separated by so-called crosspoint devices, which can be formed from thin film material.

Crosspoint devices, in effect, function as the ANN's weighted connections between neurons. Nanoscale two-terminal devices, for example memristors having "ideal" conduction state switching characteristics, are often used as the crosspoint devices in order to emulate synaptic plasticity with high energy efficiency. The conduction state (e.g., resistance) of the ideal memristor material can be altered by controlling the voltages applied between individual wires of the row and column wires. Digital data can be stored by alteration of the memristor material's conduction state at the intersection to achieve a high conduction state or a low conduction state. The memristor material can also be programmed to maintain two or more distinct conduction states by selectively setting the conduction state of the material. The conduction state of the memristor material can be read by applying a voltage across the material and measuring the current that passes through the target crosspoint device.

In order to limit power consumption, the crosspoint devices of ANN chip architectures are often designed to utilize offline learning techniques, wherein the approximation of the target function does not change once the initial training phase has been resolved. Offline learning allows the crosspoint devices of crossbar-type ANN architectures to be simplified such that they draw very little power.

Providing simple crosspoint devices that can implement forward inference of previously-trained ANN networks with low power consumption, high computational throughput and low latency would improve overall ANN performance and allow a broader range of ANN applications.

Although the present invention is directed to an electronic system, for ease of reference and explanation, various aspects of the described electronic system are described using neurological terminology such as neurons, plasticity and synapses, for example. It will be understood that for any discussion or illustration herein of an electronic system, the use of neurological terminology or neurological shorthand notations are for ease of reference and are meant to cover the neuromorphic, ANN equivalent(s) of the described neurological function or neurological component.

ANNs, also known as neuromorphic or synaptronic systems, are computational systems that can estimate or approximate other functions or systems, including, for example, biological neural systems, the human brain and brain-like functionality such as image recognition, speech recognition and the like. ANNs incorporate knowledge from a variety of disciplines, including neurophysiology, cognitive science/psychology, physics (statistical mechanics), control theory, computer science, artificial intelligence, statistics/mathematics, pattern recognition, computer vision, parallel processing and hardware (e.g., digital/analog/VLSI/optical).

Instead of utilizing the traditional digital model of manipulating zeros and ones, ANNs create connections between processing elements that are substantially the functional equivalent of the core system functionality that is being estimated or approximated. For example, a computer chip that is the central component of an electronic neuromorphic machine attempts to provide similar form, function and architecture to the mammalian brain. Although the computer chip uses the same basic transistor components as conventional computer chips, its transistors are configured to mimic the behavior of neurons and their synapse connections. The computer chip processes information using a network of just over one million simulated "neurons," which communicate with one another using electrical spikes similar to the synaptic communications between biological neurons. The architecture of such a computer chip includes a configuration of processors (i.e., simulated "neurons") that read a memory (i.e., a simulated "synapse") and perform simple operations. The communications between these processors (pathways), which are typically located in different cores, are performed by on-chip network routers.

Figure 2:
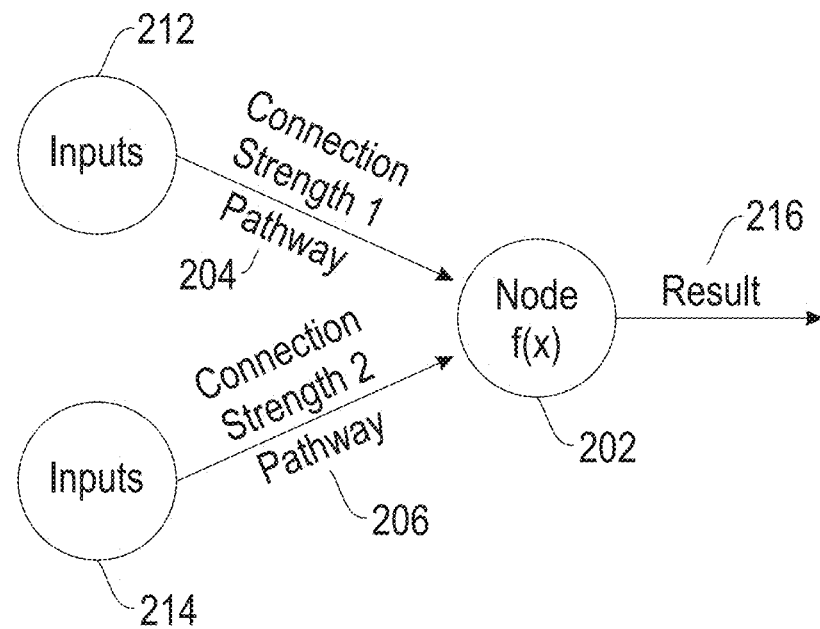
FIG. 2 depicts a simplified model of the mathematical neuron shown in FIG. 1.
Figure 3:
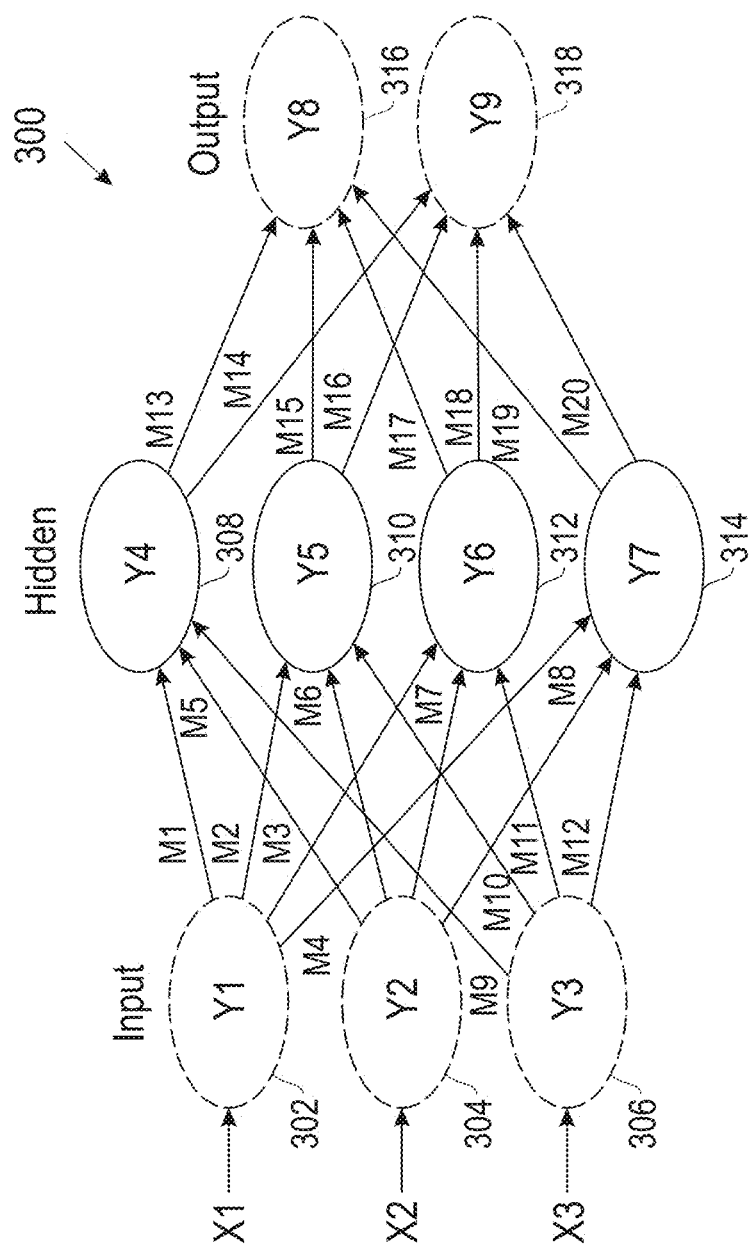
FIG. 3 depicts a simplified model of an ANN incorporating the mathematical neuron model shown in FIG. 2.

As background, a general description of how a typical ANN operates will now be provided with reference to FIGS. 1, 2 and 3. As previously noted herein, a typical ANN is a mathematical model inspired by the human brain, which includes about one hundred billion interconnected cells called neurons. FIG. 1 depicts a simplified diagram of a mathematical neuron 102 having pathways 104, 106, 108, 110 that connect it to upstream inputs 112, 114, downstream outputs 116 and downstream "other" neurons 118, configured and arranged as shown. Each mathematical neuron 102 sends and receives electrical impulses through pathways 104, 106, 108, 110. The nature of these electrical impulses and how they are processed in biological neurons (not shown) are primarily responsible for overall brain functionality. Mimicking this functionality is the intent of a mathematical ANN constructed from mathematical neurons 102 organized in a network. Just as the pathway connections between biological neurons can be strong or weak, so can the pathways between mathematical neurons. When a given neuron receives input impulses, the neuron processes the input according to the neuron's function and sends the result of the function to downstream outputs and/or downstream "other" neurons.

Mathematical neuron 102 is modeled in FIG. 2 as a node 202 having a mathematical function, f(x) depicted by the equation shown in FIG. 2. Node 202 takes electrical signals from inputs 212, 214, multiplies each input 212, 214 by the strength of its respective connection pathway 204, 206, takes a sum of the inputs, passes the sum through a function, f(x), and generates a result 216, which can be a final output or an input to another node, or both. In the present description, an asterisk (*) is used to represent a multiplication, which can be a matrix multiplication. For example, the matrix multiplication can be used to perform convolution operations between input data and one or more convolution kernels to generate output maps. Weak input signals are multiplied by a very small connection strength number, so the impact of a weak input signal on the function is very low. Similarly, strong input signals are multiplied by a higher connection strength number, so the impact of a strong input signal on the function is larger. The function f(x) is a design choice, and a variety of functions can be used. A typical design choice for f(x) is the hyperbolic tangent function, which takes the function of the previous sum and outputs a number between minus one and plus one. An alternative design choice of f(x) is a rectified linear unit (ReLU), a function in which the output matches the input for positive inputs and is zero otherwise.

FIG. 3 depicts a simplified ANN model 300 organized as a weighted directional graph, wherein the artificial neurons are nodes (e.g., 302, 308, 316), and wherein weighted directed edges (e.g., m1 to m20) connect the nodes. ANN model 300 is organized such that nodes 302, 304, 306 are input layer nodes, nodes 308, 310, 312, 314 are hidden layer nodes and nodes 316, 318 are output layer nodes. Each node is connected to every node in the adjacent layer by connection pathways, which are depicted in FIG. 3 as directional arrows having connection strengths m1 to m20. Although only one input layer, one hidden layer, and one output layer are shown, in practice, multiple input layers, hidden layers and output layers can be provided.

In this attempt to mimic the functionality of a human brain, each input layer node 302, 304, 306 of ANN 300 receives inputs x1, x2, x3 directly from a source (not shown) with no connection strength adjustments and no node summations. Accordingly, y1=f(x1), y2=f(x2) and y3=f(x3), as shown by the equations listed at the bottom of FIG. 3. Each hidden layer node 308, 310, 312, 314 receives its inputs from all input layer nodes 302, 304, 306 according to the connection strengths associated with the relevant connection pathways. Thus, in hidden layer node 308, y4=f(m1*y1+m5*y2+m9*y3), wherein * represents a multiplication. In one or more examples, the multiplication can be a matrix multiplication used to perform a convolution operation. A similar connection strength multiplication and node summation is performed for hidden layer nodes 310, 312, 314 and output layer nodes 316, 318, as shown by the equations defining functions y5 to y9 depicted at the bottom of FIG. 3.

ANN model 300 processes data records one at a time, and it "learns" by comparing an initially arbitrary classification of the record with the known actual classification of the record. Using a training methodology known as "backpropagation" (i.e., "backward propagation of errors"), the errors from the initial classification of the first record are fed back into the network and used to modify the network's weighted connections the second time around, and this feedback process continues for several iterations. In the training phase of an ANN, the correct classification for each record is known, and the output nodes can therefore be assigned "correct" values, for example, a node value of "1" (or 0.9) for the node corresponding to the correct class, and a node value of "0" (or 0.1) for the others. It is thus possible to compare the network's calculated values for the output nodes to these "correct" values, and to calculate an error term for each node (i.e., the "delta" rule). These error terms are then used to adjust the weights in the hidden layers so that in the next iteration the output values will be closer to the "correct" values.

There are many types of neural networks, but the two broadest categories are feed-forward and feedback/recurrent networks. ANN model 300 is a non-recurrent feed-forward network having inputs, outputs, and hidden layers. The signals can only travel in one direction. Input data are passed onto a layer of processing elements that perform calculations. Each processing element makes its computation based upon a weighted sum of its inputs. The new calculated values then become the new input values that feed the next layer. This process continues until it has gone through all the layers and determined the output. A threshold transfer function is sometimes used to quantify the output of a neuron in the output layer.

A feedback/recurrent network includes feedback paths, which mean that the signals can travel in both directions using loops. All possible connections between nodes are allowed. Because loops are present in this type of network, under certain operations, it can become a non-linear dynamical system that changes continuously until it reaches a state of equilibrium. Feedback networks are often used in associative memories and optimization problems, wherein the network looks for the best arrangement of interconnected factors.

The speed and efficiency of machine learning in feed-forward and recurrent ANN architectures depend on how effectively the crosspoint devices of the ANN crosspoint array perform the core operations of typical machine learning algorithms. Although a precise definition of machine learning is difficult to formulate, a learning process in the ANN context can be viewed as the problem of updating the crosspoint device connection weights so that a network can efficiently perform a specific task. The crosspoint devices typically learn the necessary connection weights from available training patterns. Performance is improved over time by iteratively updating the weights in the network. Instead of following a set of rules specified by human experts, ANNs "learn" underlying rules (like input-output relationships) from the given collection of representative examples. Accordingly, a learning algorithm can be generally defined as the procedure by which learning rules are used to update and/or adjust the relevant weights.

The three main learning algorithm paradigms are supervised, unsupervised, and hybrid. In supervised learning, or learning with a "teacher," the network is provided with a correct answer (output) for every input pattern. Weights are determined to allow the network to produce answers as close as possible to the known correct answers. Reinforcement learning is a variant of supervised learning in which the network is provided with only a critique on the correctness of network outputs, not the correct answers themselves. In contrast, unsupervised learning, or learning without a teacher, does not require a correct answer associated with each input pattern in the training data set. It explores the underlying structure in the data, or correlations between patterns in the data, and organizes patterns into categories from these correlations. Hybrid learning combines supervised and unsupervised learning. Parts of the weights are usually determined through supervised learning, while the others are obtained through unsupervised learning. Additional details of ANNs and learning rules are described in Artificial Neural Networks: A Tutorial, by Anil K. Jain, Jianchang Mao and K. M. Mohiuddin, IEEE, March 1996, the entire description of which is incorporated by reference herein.

Beyond the application of training ANNs, the forward inference of already trained networks includes applications, ranging from implementations of cloud-based services built on ANNs to smartphone, Internet-Of-Things (IOT), and other battery-constrained applications which require extremely low power operation. In general, while training is an application that calls for high throughput (in order to learn from many training examples), forward inference is an application that calls for fast latency (so that any given new test example can be classified, recognized, or otherwise processed as rapidly as possible).

In a CNN, kernels convolute overlapping regions, such as those in a visual field, and accordingly emphasize the importance of spatial locality in feature detection. Computing the convolutional layers of the CNN, typically, encompasses more than 90% of computation time in neural network training and inference. Mapping of CNNs into analog arrays and ensuring efficient use of electrical power used while performing the mathematical operations of the convolutional layers, with minimum extraneous data movement or computation, is a technical challenge. The technical challenge includes mapping the CNN for inference as well as for training. The technical solutions described herein facilitate row-by-row CNN mapping for training the CNN. As such the technical solutions are rooted in and/or tied to computer technology in order to overcome a problem specifically arising in the realm of computers, specifically neural networks, and more particularly convolutional neural networks.

The technical solutions provided by embodiments of the present invention address such technical problems by using row-by-row mapping method for training workload with additional peripheral circuitry for back/reverse propagation during the training phase. Further, embodiments of the present invention facilitate weight update to be performed efficiently. In one or more embodiments of the present invention, weight updates are performed using in-situ crossbar compatible updates. Alternatively, the weight updates are performed using zeroing and periodic synchronization, which can be made even more efficient with modifications to the peripheral circuitry. In yet other embodiments of the present invention, a mixed precision update can be performed with additional peripheral components; this technique can be more compatible with CNNs that have fully connected layers.

Figure 4:
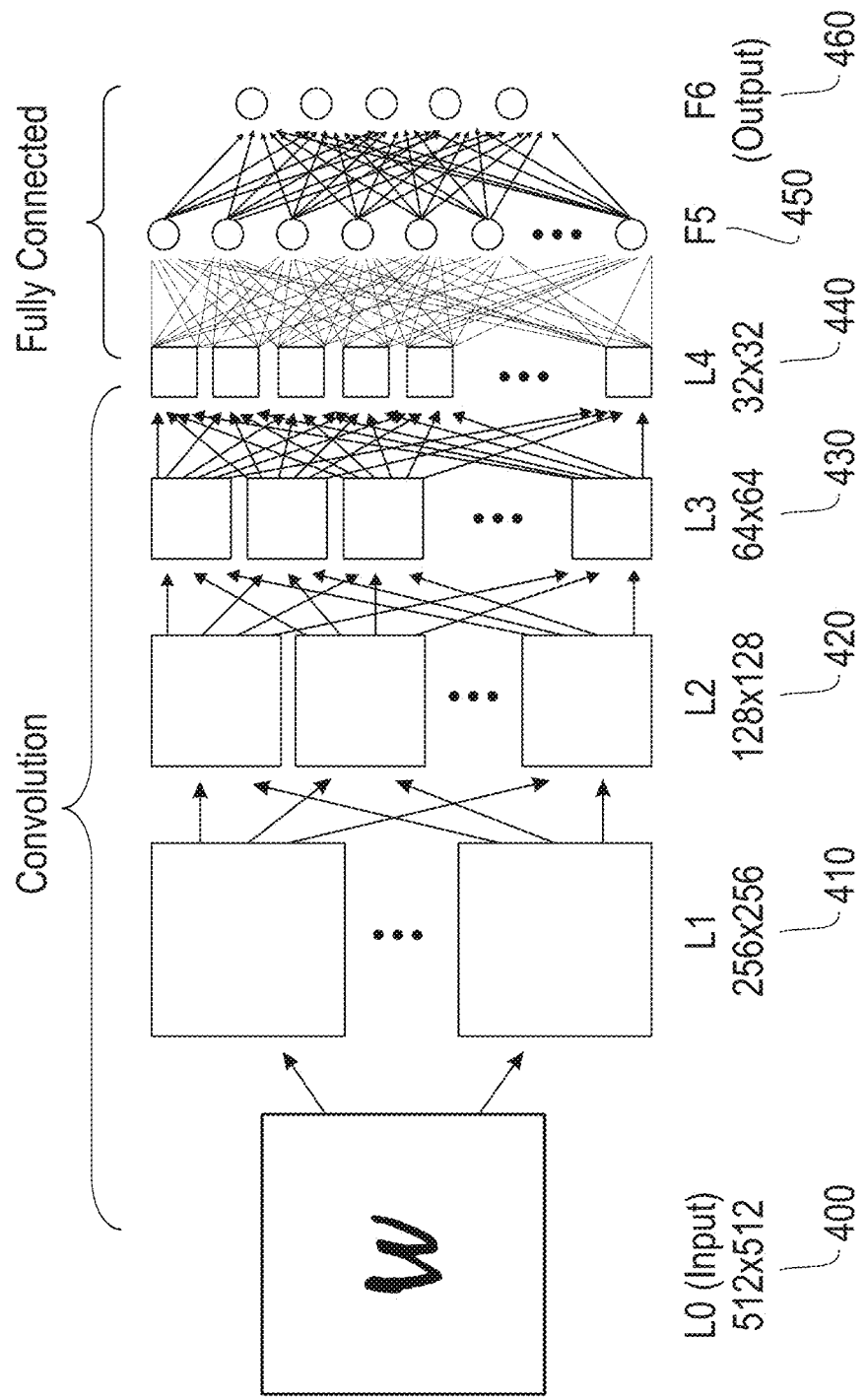
FIG. 4 illustrates a simplified block diagram of a representative CNN, which is interpreting a sample input map.

FIG. 4 illustrates a simplified block diagram of a CNN. In the depicted example, the CNN is being used for interpreting a sample input map 400, and in this particular example uses a handwritten letter "w" as an input map. However, it is understood that other types of input maps are possible, and also that the technical solutions described herein are applicable to a CNN performing other operations, such as other types of feature detections. In the illustrated example, the input map 100 is used to create a set of values for the input layer 410, or "layer-1." For example, layer-1 can be generated by direct mapping of a pixel of the sample input map 400 to a particular neuron in layer-1, such that the neuron shows a 1 or a 0 depending on whether the pixel exhibits a particular attribute. Another example method of assigning values to neurons is discussed below with reference to convolutional neural networks. Depending on the vagaries of the neural network and the problem it is created to solve, each layer of the network can have differing numbers of neurons, and these may or may not be related to particular qualities of the input data.

Referring to FIG. 4, neurons in layer-1 410 are connected to neurons in a next layer, layer-2 420, as described earlier (see FIG. 3). The neurons in FIG. 4 are as described with reference to FIG. 1. A neuron in layer-2 420, consequently, receives an input value from each of the neurons in layer-1 410. The input values are then summed and this sum compared to a bias. If the value exceeds the bias for a particular neuron, that neuron then holds a value, which can be used as input to neurons in the next layer of neurons. This computation continues through the various layers 430-450 of the CNN, which include at least one FC layer 450, until it reaches a final layer 460, referred to as "output" in FIG. 4. In some CNN networks, "residual" results from earlier layers may be combined with the results of later layers, skipping over the layers in between. In an example of a CNN used for character recognition, each value in the layer is assigned to a particular character. When designed for classification tasks, the network is configured to end with the output layer having only one large positive value in one neuron, which then demonstrates which character the network has computed to be the most likely handwritten input character. In other scenarios, the network may have been designed such that output neuron values may be used to estimate probability (likelihood), confidence or other metrics of interest.

The data values for each layer in the CNN are typically represented using matrices (or tensors in some examples) and computations are performed as matrix computations. The indexes (and/or sizes) of the matrices vary from layer to layer and network to network, as illustrated in FIG. 4. Different implementations orient the matrices or map the matrices to computer memory differently. Referring to FIG. 4, in the example CNN illustrated, each level is a tensor of neuron values, as is illustrated by matrix dimensions for each layer of the neural network. At the input of the CNN, an example might be multiple input "planes," each a two-dimensional image. For instance, there might be a red plane, a green plane, and a blue plane, stemming from a full-color image. Deeper into the CNN, layers may take intermediate data in the form of many "planes" and produce for the next layer a large number of output planes. The values in an input tensor at a layer are multiplied by connection strengths, which are in a transformation tensor known as a filter. This matrix multiplication scales each value in the previous layer according to the connection strengths, with the aggregate total of these contributions then summed. This fundamental operation is known as a multiply-accumulate operation. A bias matrix may then added to the resulting product matrix to account for the threshold of each neuron in the next level. Further, an activation function is applied to each resultant value, and the resulting values are placed in the output tensor to be applied to the next layer. In an example, the activation function can be rectified linear units, sigmoid, or tanh( ). Thus, as FIG. 4 shows, the connections between each layer, and thus an entire network, can be represented as a series of matrices. Training the CNN includes finding proper values for these matrices.

While fully-connected neural networks are able, when properly trained, to recognize input patterns, such as handwriting or photos of household pets, etc., they do not exhibit shift-invariance. In order for the network to recognize the whiskers of a cat, it must be supplied with cat images with the whiskers located at numerous different 2-D locations within the image. Each different image location will lead to neuron values that interact with different weights in such a fully-connected network. In contrast, in a CNN, the connection strengths are convolution kernels. The convolution operation introduces shift-invariance. Thus, as multiple images are presented with cats with whiskers, as long as the scale, color and rotation of the whiskers is unchanged from image to image, the 2-D position within the image no longer matters. Thus, during training, all examples of similar features work together to help learn this feature, independent of the feature location within the 2-D image. After training, a single or much smaller set of filters is sufficient to recognize such image features, allowing a bank of many filters (which is what a CNN layer is) to then recognize many different features that are useful for discriminating images (dogs from cats, or even subtleties that are representative of different breeds of cats).

Figure 5:
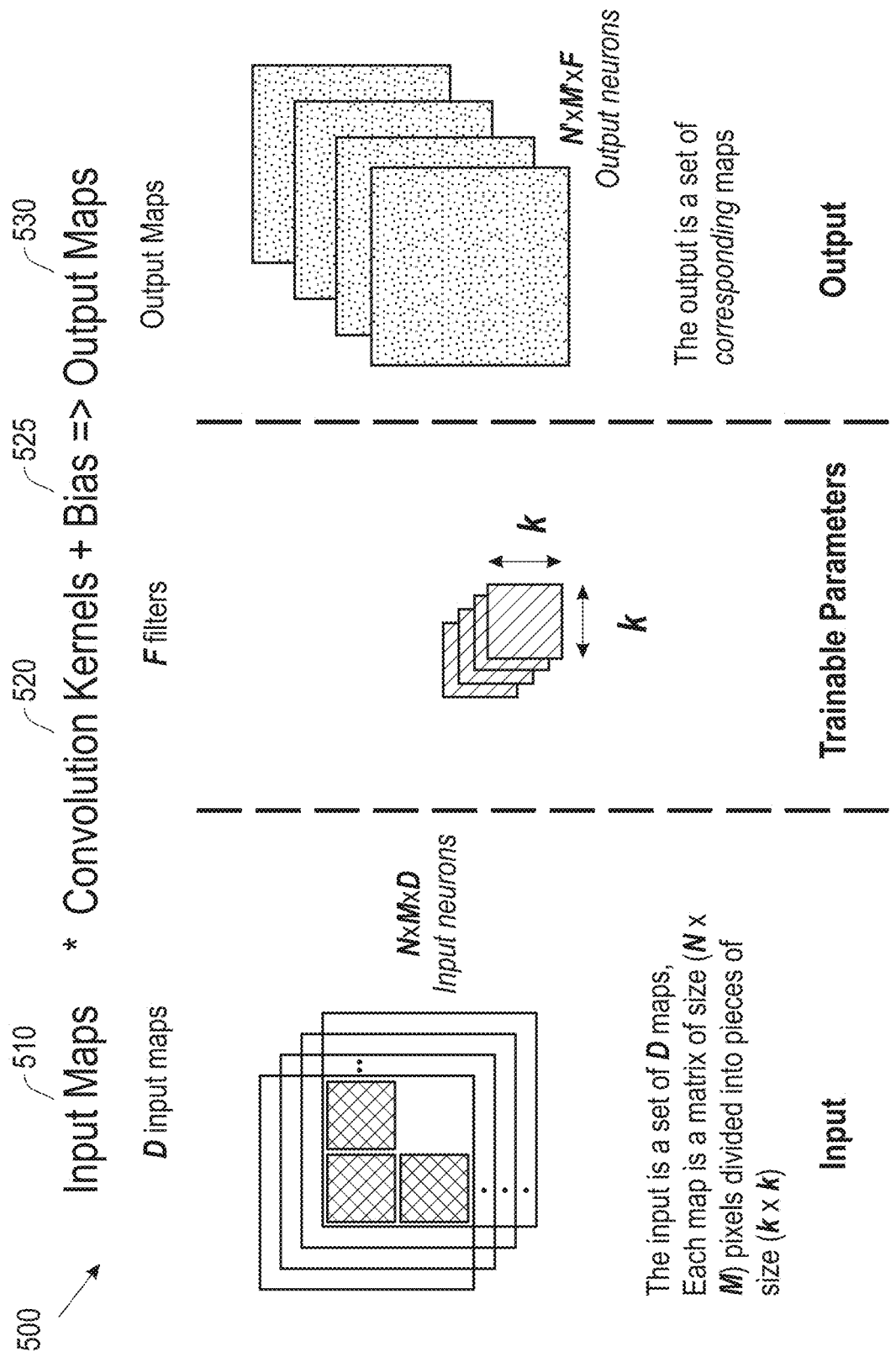
FIG. 5 illustrates an example convolutional layer in a CNN being trained using training data that include input maps and convolution kernels.

FIG. 5 illustrates an example convolutional layer 500 in a CNN being trained using training data that include input maps 510 and convolution kernels 520. For simplicity, FIG. 5 does not illustrate bias matrices 525. The input maps 510 (also referred to as input planes) can include multiple input patterns, for example, D input maps. Each input map is a matrix, such as a matrix of size N×M. Accordingly, a total number of input neurons in this case is N×M×D. The input maps are convolved with F convolution kernels 520 of size k×k as illustrated to produce corresponding output maps 530. Each output map can have a dimension N'×M'. In case the input maps are square matrices of size n, the output maps are of size n−k+1×n−k+1. Each convolution is a 3D convolution involving the D input maps. A CNN can include multiple such layers, where the output maps 530 from a previous layer are used as input maps 510 for a subsequent layer. The backpropagation algorithm can be used to learn the k×k×D×F weight values of the filters.

For example, the input maps 510 are convolved with each filter bank to generate a corresponding output map. For example, in case the CNN is being trained to identify handwriting, the input maps 510 are combined with a filter bank that includes convolution kernels representing a vertical line. The resulting output map identifies vertical lines that are present in the input maps 510. Further, another filter bank can include convolution kernels representing a diagonal line, such as going up and to the right. An output map resulting from a convolution of the input maps 510 with the second filter bank identifies samples of the training data that contain diagonal lines. The two output maps show different information for the character, while preserving pixel adjacency. This can result in more efficient character recognition.

Figure 6:
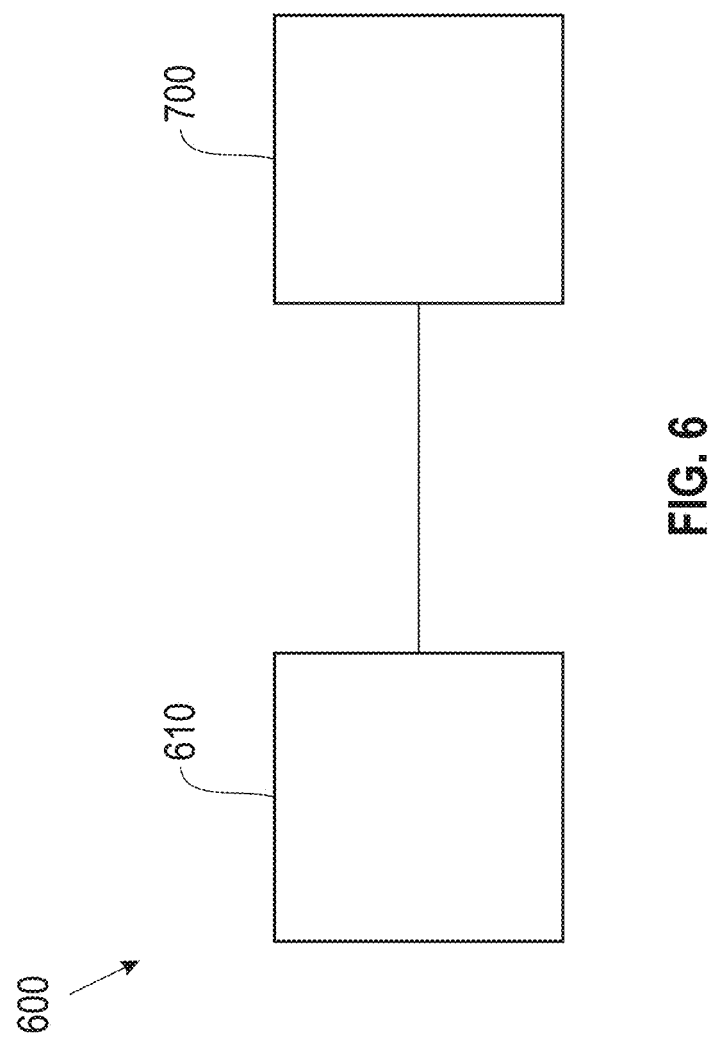
FIG. 6 depicts a system for performing a matrix-matrix multiplication using a crosspoint array according to one or more embodiments of the present invention.

FIG. 6 depicts a system 600 in which the crosspoint array 700 is controlled using a controller 610 for performing the matrix-matrix multiplication(s) among other operations according to one or more embodiments of the present invention. For example, the controller 610 sends the input data 510 to be multiplied by the crosspoint array 700. In one or more examples, the controller 610 stores the weight values, such as from convolution kernels 520 in the crosspoint array 700 and sends the input vectors. In one or more examples, the controller 610 and the crosspoint array 700 are coupled in a wired or a wireless manner, or a combination thereof. The controller 610 further sends an instruction/command to the crosspoint array 700 to initiate the operations for one or more layers in the CNN. The controller 610 further can read the output data 530 from the crosspoint array 700 after receiving a notification that the computations have been performed. The controller 610 can be a processing unit, or a computing system, such as a server, a desktop computer, a tablet computer, a phone, and the like. The controller 610 can include a memory device that has computer executable instructions stored therein; the instructions when executed by the controller cause the matrix-matrix computation.

Turning now to an overview of the present description, one or more embodiments are directed to a crosspoint array having crosspoint devices at each intersection of the crossbar wires, the crosspoint array being used to implement the CNN. An example of a crosspoint device is a two-terminal programmable resistive crosspoint component referred to herein as a resistive processing unit (RPU), which provides local data storage functionality and local data processing functionality. When performing data processing, the weighted contribution represented by each crosspoint device is contributed into a massively-parallel multiply-accumulate operation that is performed at the stored location of data. This eliminates the need to move relevant data in and out of a processor and a separate storage element. Accordingly, implementing a machine learning CNN architecture having the described crosspoint device enables the implementation of online machine learning capabilities that facilitate training the CNN, and subsequently, performing inference using the trained CNN models. The described crosspoint device and resulting CNN architecture improve overall CNN performance and enable a broader range of practical CNN applications.

The described crosspoint device can be implemented as two-terminal resistive crosspoint devices. For example, the described crosspoint device can be implemented with resistive random access memory (RRAM), phase change memory (PCM), programmable metallization cell (PMC) memory, non-linear memristor systems, or any other device that offers a wide range of analog-tunable non-volatile resistive memory states that are sufficiently stable over time.

Figure 7:
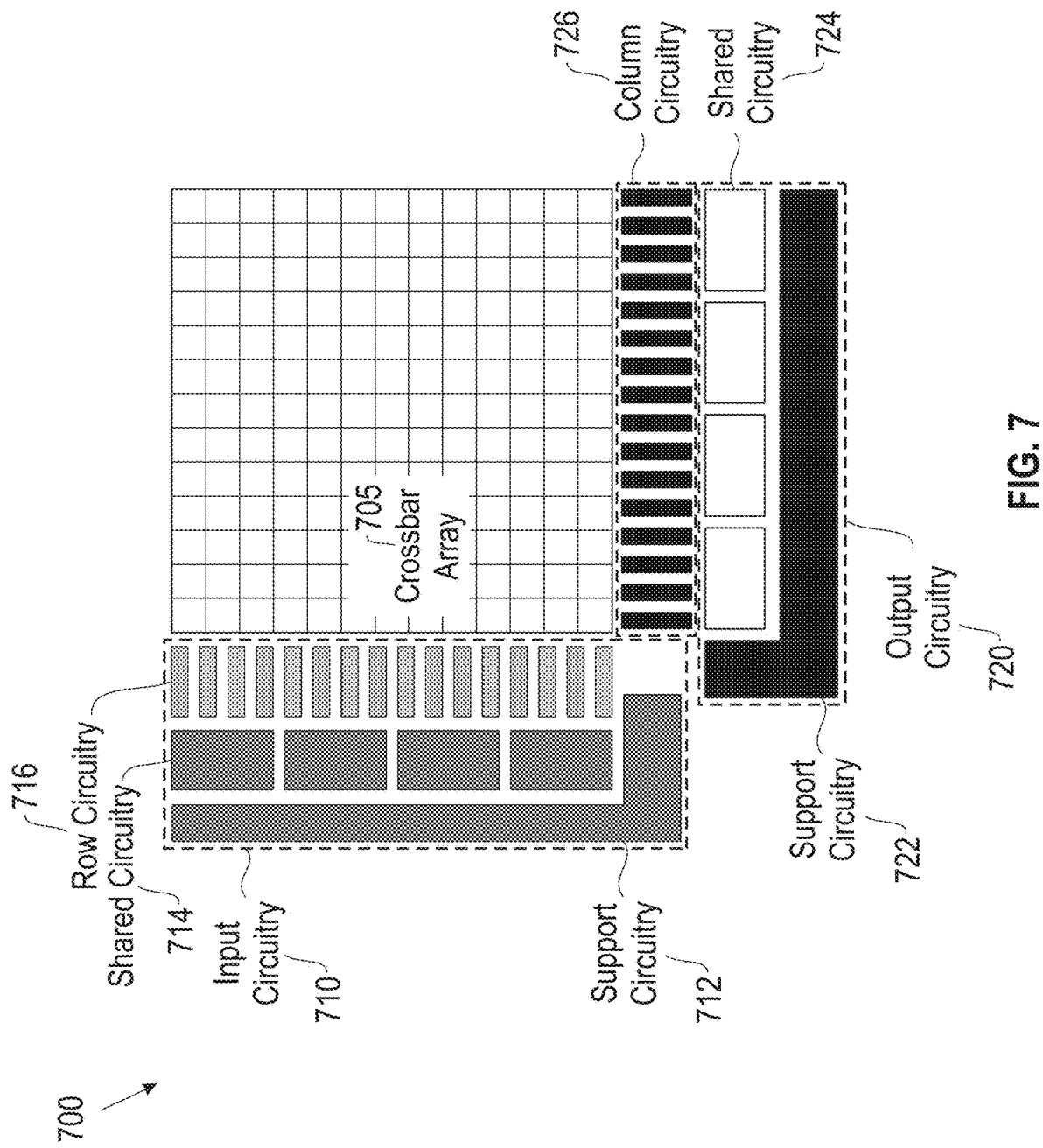
FIG. 7 depicts a two-dimensional (2D) crossbar system that performs forward matrix multiplication, backward matrix multiplication and weight updates according to the present description.

FIG. 7 depicts a two-dimensional (2D) crossbar system 700 that performs forward inference according to the present description. The crossbar system 700 can be used to implement simple matrix multiplication, backward matrix-multiplication, and even in-situ weight-update according to the backpropagation algorithm. The crossbar system 700 includes a crosspoint array 705, an input circuitry 710, and an output circuitry 720, among other components. The input circuity 710 and the output circuitry 720 can be, together, referred to as peripheral circuitry. The crossbar system 700 can be a computer chip in one or more examples.

Figure 8:
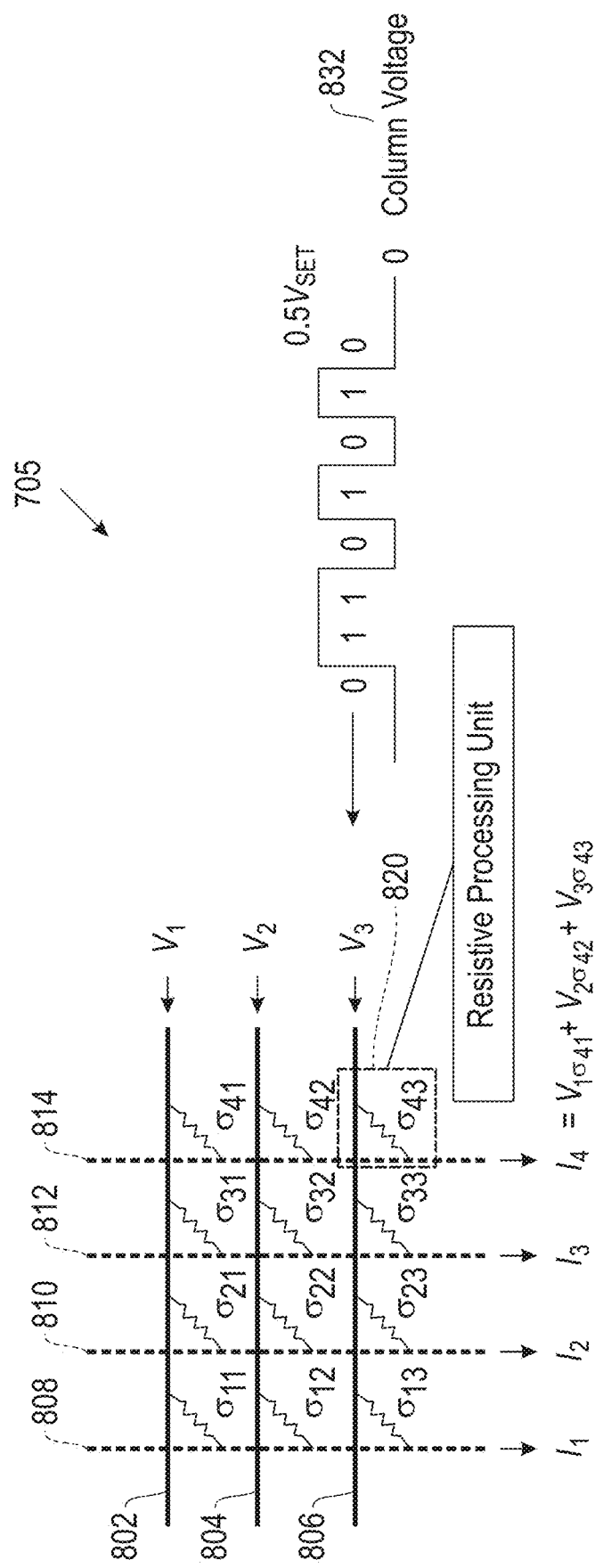
FIG. 8 depicts an expanded view of the crosspoint array according to one or more embodiments.

FIG. 8 depicts an expanded view of the crosspoint array 705 according to one or more embodiments. The crosspoint array 705 is formed from a set of conductive row wires 802, 804, 806 and a set of conductive column wires 808, 810, 812, 814 that intersect the set of conductive row wires 802, 804, 806. The intersections between the set of row wires and the set of column wires are separated by crosspoint devices, which are shown in FIG. 8 as resistive elements each having its own adjustable/updateable resistive weight, depicted as $\sigma_{11}$, $\sigma_{21}$, $\sigma_{31}$, $\sigma_{41}$, $\sigma_{12}$, $\sigma_{22}$, $\sigma_{32}$, $\sigma_{42}$, $\sigma_{13}$, $\sigma_{23}$, $\sigma_{33}$ and $\sigma_{43}$, respectively. For ease of illustration, only one crosspoint device 820 is labeled with a reference number in FIG. 8. In forward matrix multiplication, the conduction state (i.e., the stored weights) of the crosspoint device can be read by applying a voltage across the crosspoint device and measuring the current that passes through the crosspoint device.

Input voltages $V_1$, $V_2$, $V_3$ are applied to row wires 802, 804, 806, respectively. Each column wire 808, 810, 812, 814 sums the currents $I_1$, $I_2$, $I_3$, $I_4$ generated by each crosspoint device along the particular column wire using an integrator, such as a capacitor. For example, as shown in FIG. 8, the current $I_4$ generated by column wire 814 is given by $I_4=V_1o_{41}+V_2o_{42}+V_3o_{43}$. Thus, array 705 computes the forward matrix multiplication by multiplying the values stored in the crosspoint devices by the row wire inputs, which are defined by voltages $V_1$, $V_2$, $V_3$.

Referring to FIG. 7, the input circuitry 710 includes, in one or more examples, at least a support circuitry 712, a shared circuitry 714, and a row circuitry 716. The row circuitry includes hardware components associated with each row wire 802, 804, and 806. The input circuitry 710 facilitates providing the input voltages to the crosspoint array 705.

Figure 9:
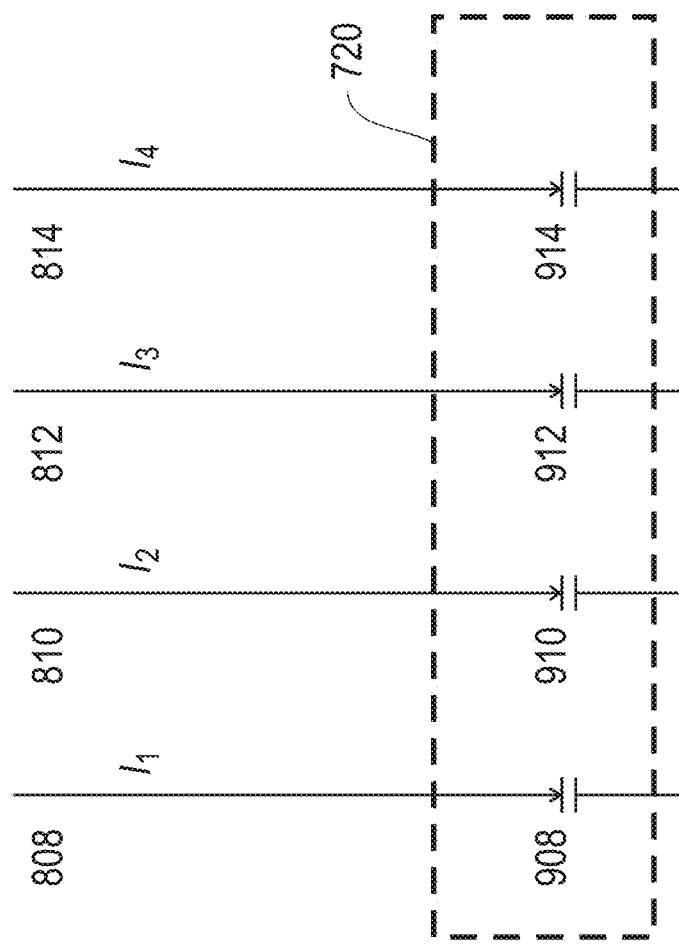
FIG. 9 depicts a typical output circuitry in a crossbar system.

FIG. 9 depicts a typical output circuitry 720. The output circuitry includes integrators 908, 910, 912, and 914 corresponding to the column wires 808, 8120, 812, and 814. The integrators 908, 910, 912, and 914, in one or more examples, are capacitors. The output currents along each column wire are accumulated in the integrators and passed on to a next layer of the CNN. As described earlier, such an arrangement of the integrators makes the computations of the FC layers very efficient. However, for the convolution operations, to use such an arrangement of the integrators incurs significant additional overhead in terms of data transport, storage, organization and subsequent data transport. Such operations require additional resources such as time, power, and additional circuit-area, thus making the overall system inefficient.

Figure 10:
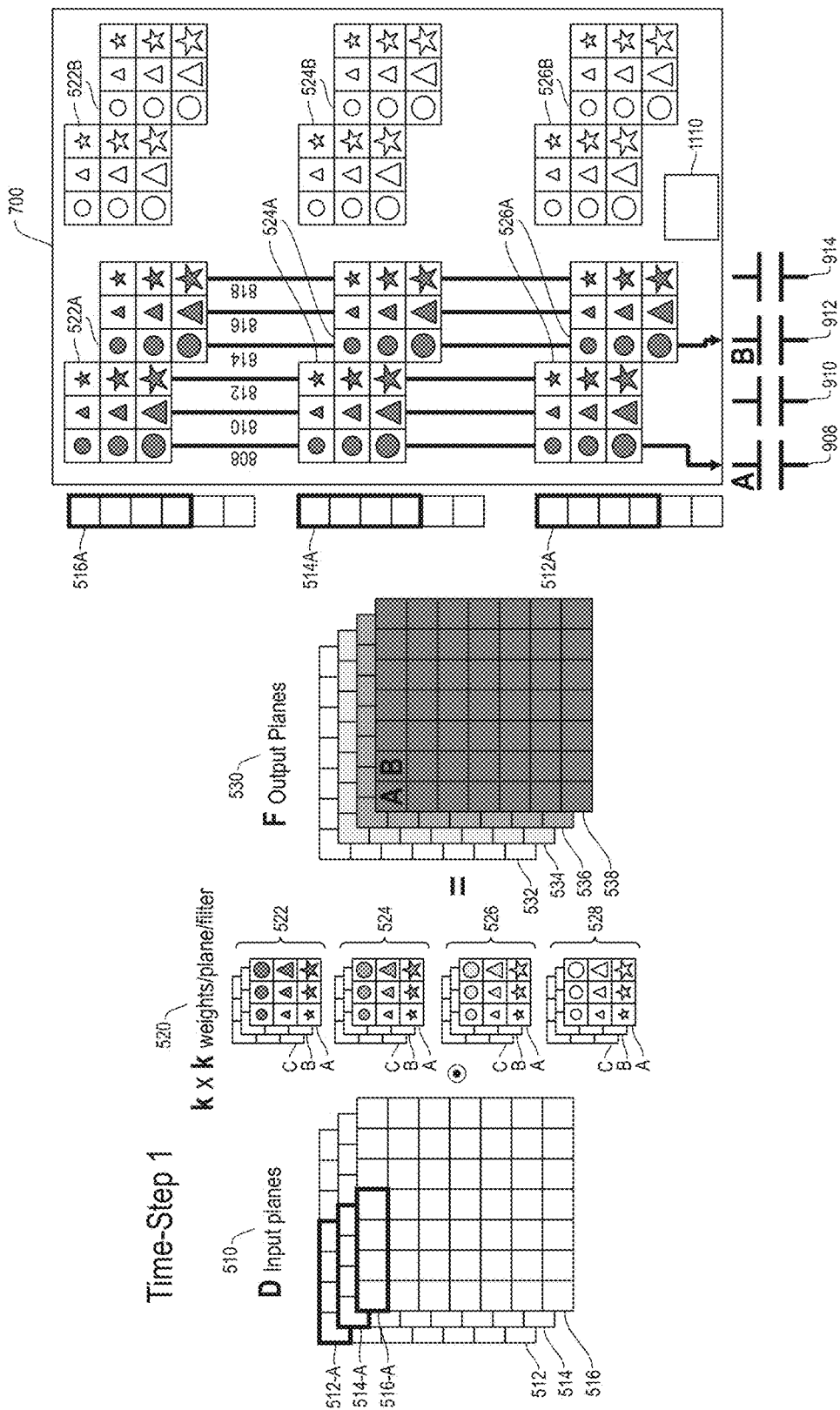
FIG. 10 depicts existing operations to perform forward propagation operations using a crosspoint array.

FIG. 10 depicts existing operations to perform forward propagation operations using the crosspoint array. It should be noted that the dimensions of the matrices shown in the figures herein are just examples, and the one or more examples different dimensions can be used.

As depicted in FIG. 10, one image-row (512, 514, and 516) of all input planes 510 is presented concurrently as a column of inputs to the array-rows (802, 804, and 806) of the crosspoint array 705 of the crossbar system 700. The crosspoint devices 820 at each crosspoint contain weight-elements from the filters 525, each leading to a multiplication between the array-row excitation, $x_i$, and the stored weight, $w_{ij}$ by Ohm's law (voltage times conductance equals current). The integration of all such read current contributions is summed along each array-column, and stored in the corresponding integrators (908, 910, 912, and 914) of the array-columns (808, 810, 812, and 814). The computation can be expressed as: the current $I_1$ on column #1 (808) is stored on capacitor $C_1$ (908), $I_2$ is stored on capacitor $C_2$, $I_3$ on $C_3$, and so on. In the existing technical solutions that use such crosspoint arrays 705, the integrated charge on the capacitors (908, 910, 912, and 914) is treated as the output of the multiply-accumulate, and is either converted to a digital number or to pulse-duration for shipment to a next array 705.

In this manner, at each time-step (i.e., each computation performed by the array 705), values across all input planes 510 are integrated producing an output for all output planes 530. However, this results only in one output pixel per time-step.

Further, every output from convolutional layer i has to be combined with outputs from other convolutional layers as part of pooling. The other convolutional layers from which the outputs that are to be pooled depend on the number of elements in the filter kernels 520. Alternatively, or in addition, every output from layer i has to be positioned at different spots in the input planes 510 for the convolutional layer i+1. Such organization of the output values for the purpose of pooling can also require additional computing resources, such as read-write access, power and the like.

Accordingly, in existing systems, at time-step-1, the system 700 integrates results into capacitors 908, 910, 912, and 914, but does not immediately send the result to the next layer. That is because the system 700 has to steer read current from several different columns onto the integration capacitor(s) 908, 910, 912, and 914. The system 700 performs such steering of the results from other columns at subsequent time-steps. In the same manner, the system 700 takes k time-steps to compute each kth output row.

It should be noted that once the CNN is trained, forward inference is streamlined and does not require activation storage. During the training phase of the CNN, the backward pass requires some reuse of error signals and reverse order circuitry, but portions of the peripheral circuits, such as activation capacitors, can be reused for such purpose. However, during weight update, extra reset steps have to be performed because of such steering, which can otherwise cause unintended updates in the crosspoint array 705. Further, the system 700 has to synchronize copies of weights to ensure good convergence during the weight update phase. Because of these technical challenges, the speed of the weight update phase is hampered.

The technical solutions described herein address such technical challenges of the existing technical solutions by facilitating a row-by-row mapping in a CNN during a training phase, including for the back propagation and weight update phases.

Figure 11:
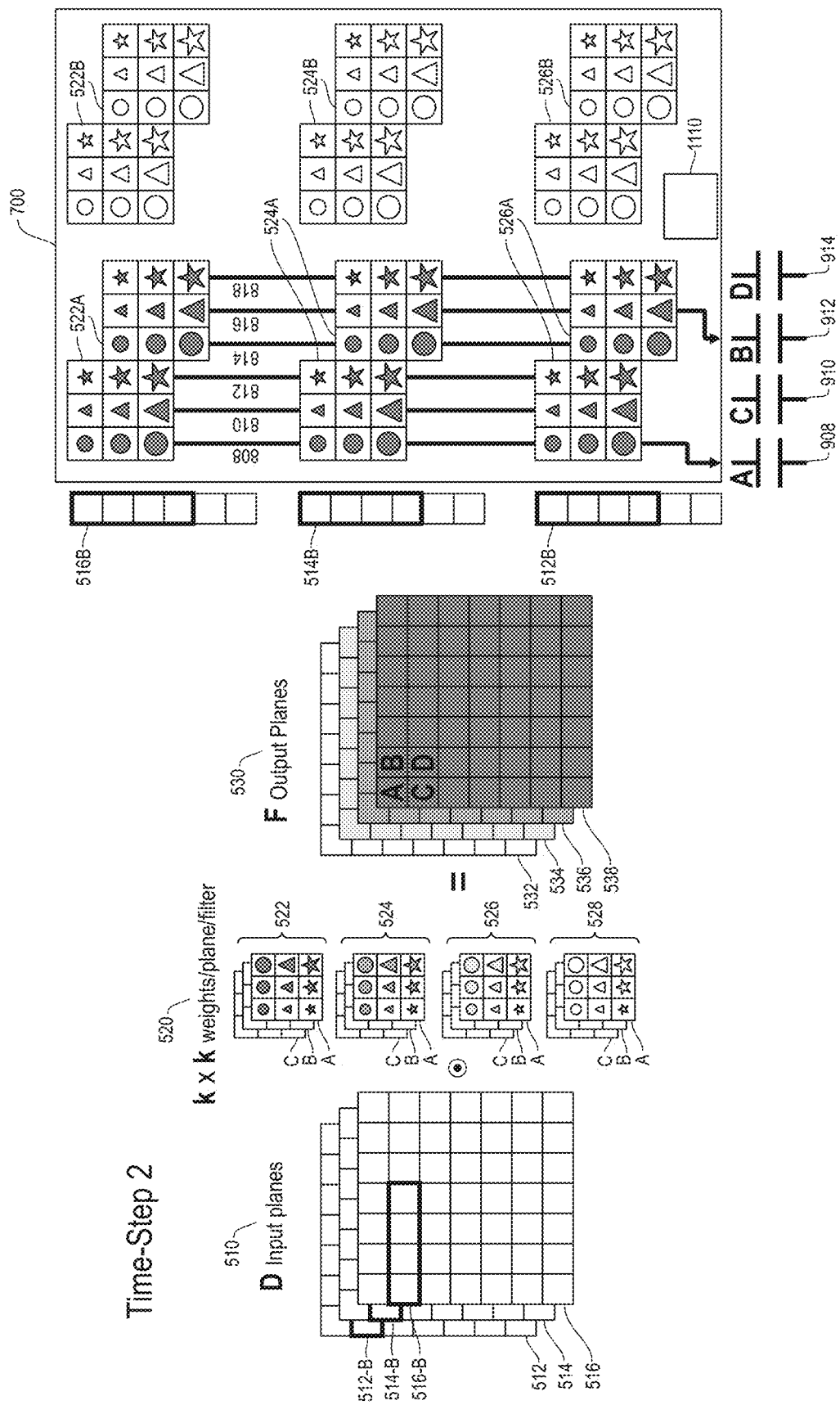
FIG. 11 depicts performing forward propagation operations using selective integrators according to one or more embodiments.
Figure 12:
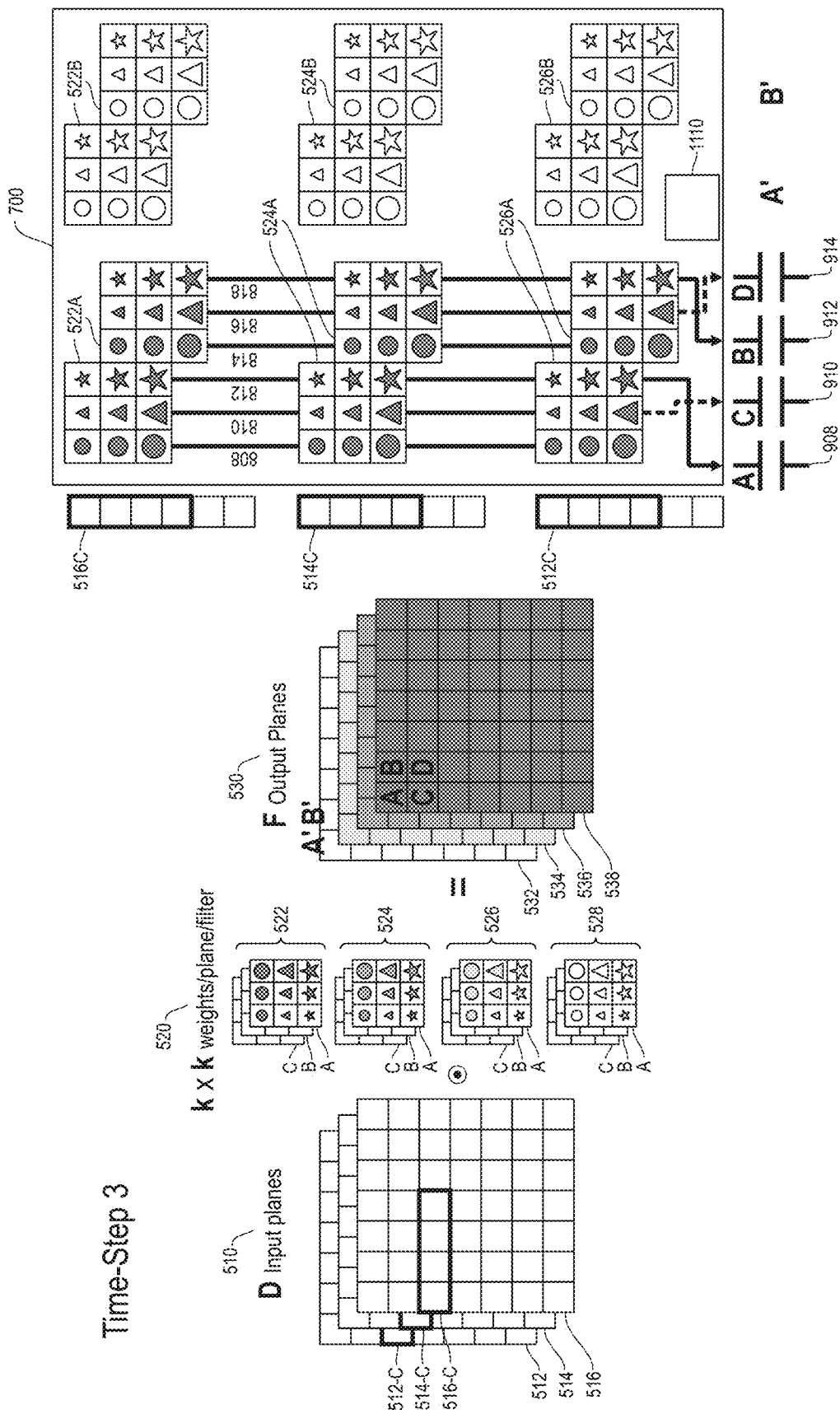
FIG. 12 depicts performing forward propagation operations using selective integrators according to one or more embodiments.

FIGS. 10-12 depict the operations performed by the array 705 during forward propagation with the modified output circuit 720 according to one or more embodiments. At each time-step, each of the integrators (908, 910, 912, and 914) receives contributions from k*p multiply-accumulate terms, where p is the number of input planes 510. After k time-steps, the total charge on an integrator contains all k*k*p terms and is ready to be output to the next convolutional layer. Except for during the first k or last k time-steps, after each integration step, every kth integrator from the output circuit 720 reaches this status, and accordingly, is ready to generate all the output pixels of one image-row (512-A, 514-A, and 516-A) of the convolutional-layer output. All other jth integrators have a different phase in their respective integration phase, depending the value of j.

For example, as shown in FIG. 10, at time-step 1 of the forward propagation, the first rows of each input plane 512-A, 514-A, 516-A are input to the convolutional layer. The crosspoint devices 820 of the crosspoint array 705 are loaded with the filters 520 as shown. Particularly, filter kernels 522-A and 522-B are loaded in the crosspoint devices 820 to perform a convolution with the first rows of the first input plane 516-A. Similarly, filter kernels 524-A and 524-B from a second bank of filter kernels 520 are convolved with the first row of a second input plane 514-A, and so on. The results of the respective convolutions are forwarded to one or more of the integrators (908, 910, 912, 914) from the output circuitry 720 by output controller 1110.

The output controller 1110 can be part of the output circuitry 720, or an external controller that is coupled with the output circuitry 720. The output controller 1110 steers the output of the multiply-accumulate operations from each column in the array 705 to a particular integrator in the output circuitry 720. In one or more examples, the output controller 1110 receives a mode signal that provides a selection of the integrators for each column at each time-step. Alternatively, the output controller 1110 is provided a mode signal that indicates the selection of the integrator for each column until all convolutional layers are executed. The mode signal, in one or more examples, can be a bit pattern that is indicative of the selected integrators for each column.

In the example of FIG. 10, the outputs from the columns 808 and 814 are stored in the integrators 908 and 912 respectively, at time-step #1. FIG. 11 depicts the operations performed in time-step #2. Here, second rows 512-B, 514-B, and 516-B from the input planes 510 are used as input to the crosspoint array 705. The crosspoint devices 820 are still loaded with the kernel filters 520 as in time-step #1 (FIG. 10). In the time-step #2, the output controller 1110 selects the same integrators 908 and 912 for the outputs of the columns 810 and 816 (different from time-step #1). Accordingly, the integrators 908 and 912, in this case receive outputs from different columns in different time-steps.

FIG. 12 depicts the operations performed in time-step #3. In a similar manner to the first two time-steps, in time-step #3, a third row 512-C, 514-C, and 516-C from the input planes 510 is used as input to the crosspoint array 705. In the time-step #3, the output controller 1110 selects the same integrators 908 and 912 for the outputs of the columns 812 and 818 (different from time-step #1). Accordingly, the integrators 908 and 912, in this case, receive outputs from different columns in different time-steps. In this manner, in general, after k time-steps, an entire row in the output planes 530 is computed (compared to a single output pixel in the existing solution).

It should be noted that, while only the computations of the first two entries (A and B) from the first output row in the output plane 530 are described above, in a similar manner, the other portions of the output planes 530 are computed in parallel by other portions of the crosspoint array 705. Further yet, the crosspoint array 705 can be accumulating for other output rows (C and D) at each time-step using the other integrators (910 and 914) as shown in FIG. 12.

Accordingly, as a result of the output controller 1110 steering the output of the crosspoint array 705, all input is in the form of a complete and contiguous image-row over all input planes. Further, after the first k time-steps before any output is available, that is from the k+1$^{th}$ time-step, a complete and contiguous image-row over all the output planes is produced at each time-step. Accordingly, the output maps 530 produced by such operations can be pipelined to a subsequent convolutional layer without any intermediate storage of the neuron excitations. Because pooling operations such as sum, average and maximum can be performed incrementally on data as they arrive, any pooling operation only requires temporary storage sufficient for the output image-row. These intermediate results are stored and updated as each set of neuron excitations arrive, until the R-by-R pooling operation is complete, at which point the buffer of intermediate results is effectively the output of the pooling layer.

Figure 13:
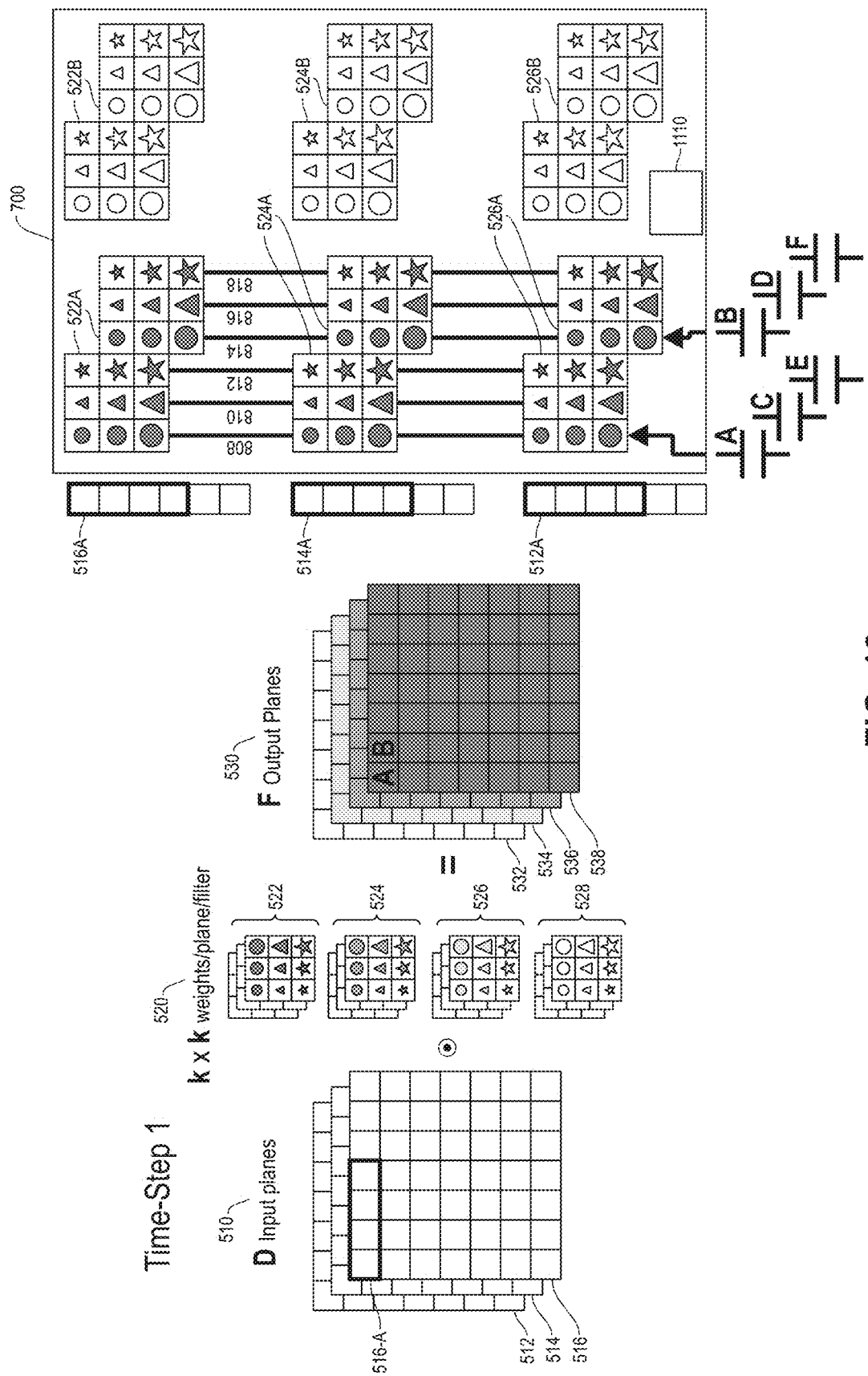
FIG. 13 depicts operations performed by a crosspoint array during backpropagation phase of training the CNN according to one or more embodiments.
Figure 15:
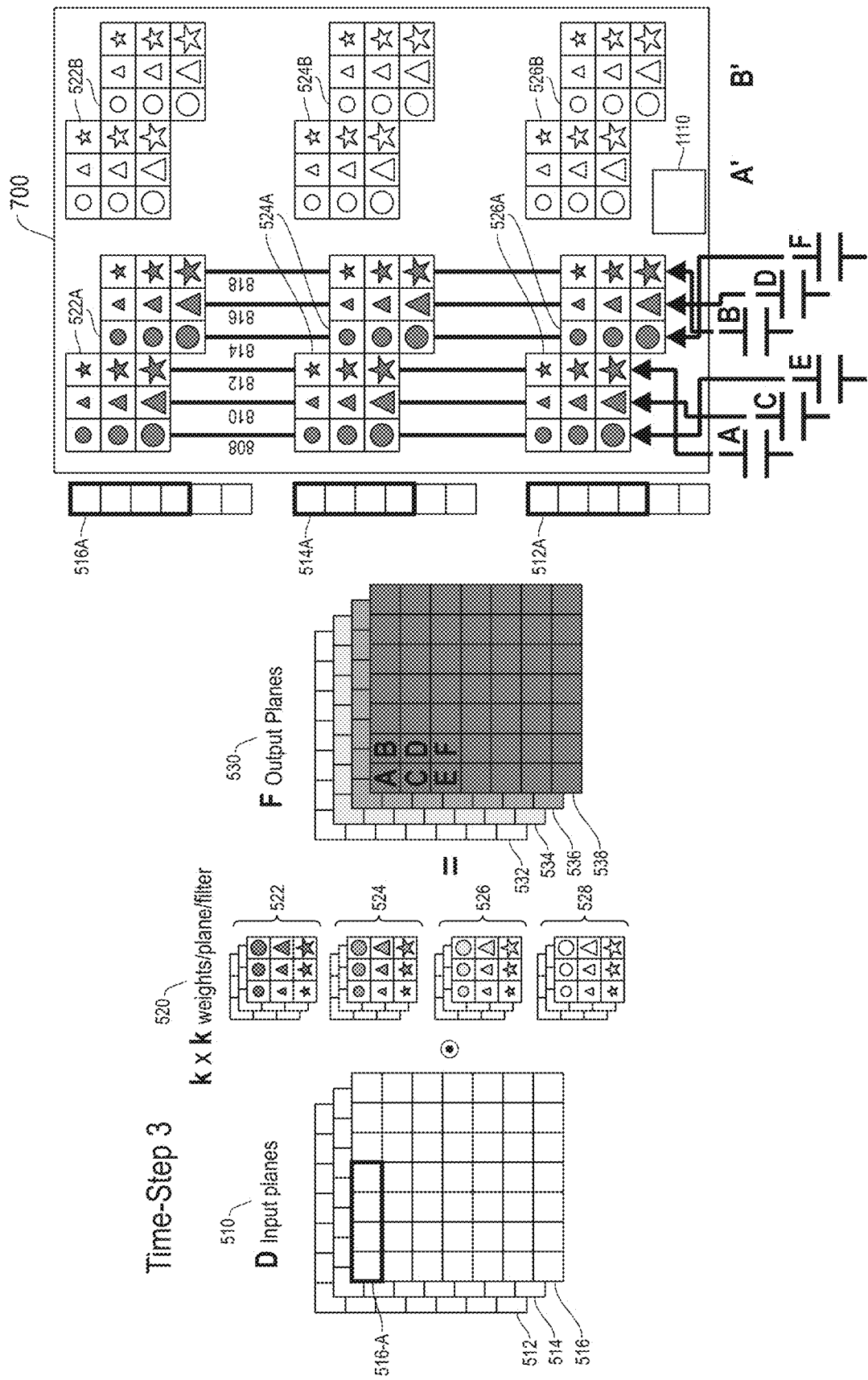
FIG. 15 depicts operations performed by a crosspoint array during backpropagation phase of training the CNN according to one or more embodiments.

FIG. 13 depicts operations performed by the crosspoint array 705 during backpropagation phase of training the CNN according to one or more embodiments. As is described herein, and is depicted in FIG. 15, the error signal that is computed during back propagation is propagated in direct opposite direction from forward propagation. This makes it possible to reuse the capacitors that were used for storing forward activation values (e.g., A and B) for backward error propagation. A partial sum is accumulated in the support circuitry 712 and the input circuitry 710, in the place of the input data, in this case 512-A, 514-A, and 516-A.

The partial sum that is stored is the difference, i.e., error, in the expected value at each pixel and the computed value. For example, the computed value A is compared with an expected value at that pixel position in the output. The expected value is known during the training phase. The error signal is accumulated, i.e., added with an existing value that is stored in the input circuit 710.

Figure 14:
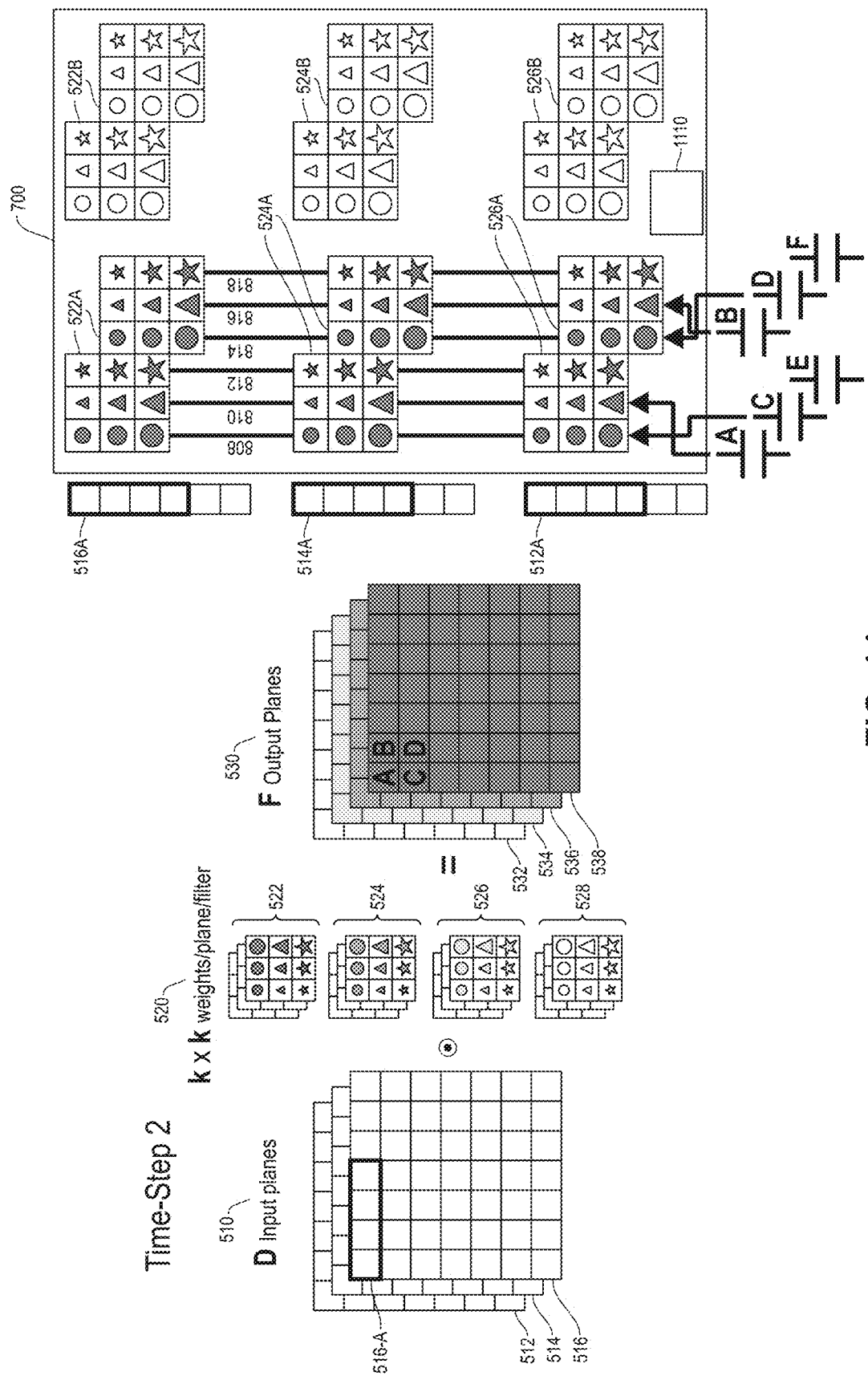
FIG. 14 depicts operations performed by a crosspoint array during backpropagation phase of training the CNN according to one or more embodiments.

Further, in the time-step 2, as shown in FIG. 14, the error signal for the next row (row #2) is computed by back propagating the first computed value for the first row via a second row. The process continues and in time-step 3, as shown in FIG. 15, a partial sum of the error signal for the next row (row #3) is computed by back propagating the first computed value via the third row.

Figure 16:
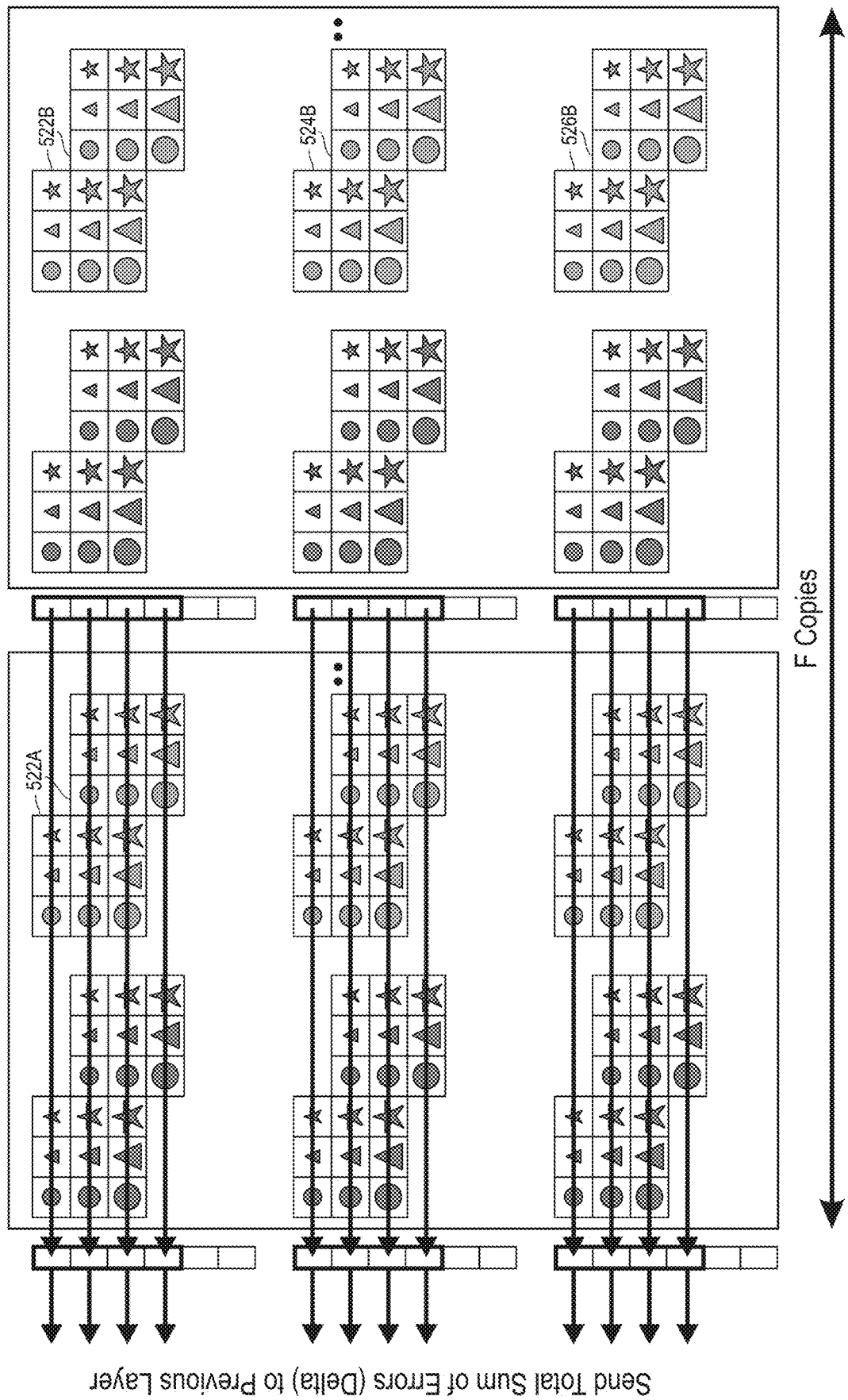
FIG. 16 depicts operations in back propagation where accumulated partial errors corresponding to each filter in a CNN are added and sent to a previous layer in the CNN according to one or more embodiments of the present invention.
Figure 17:
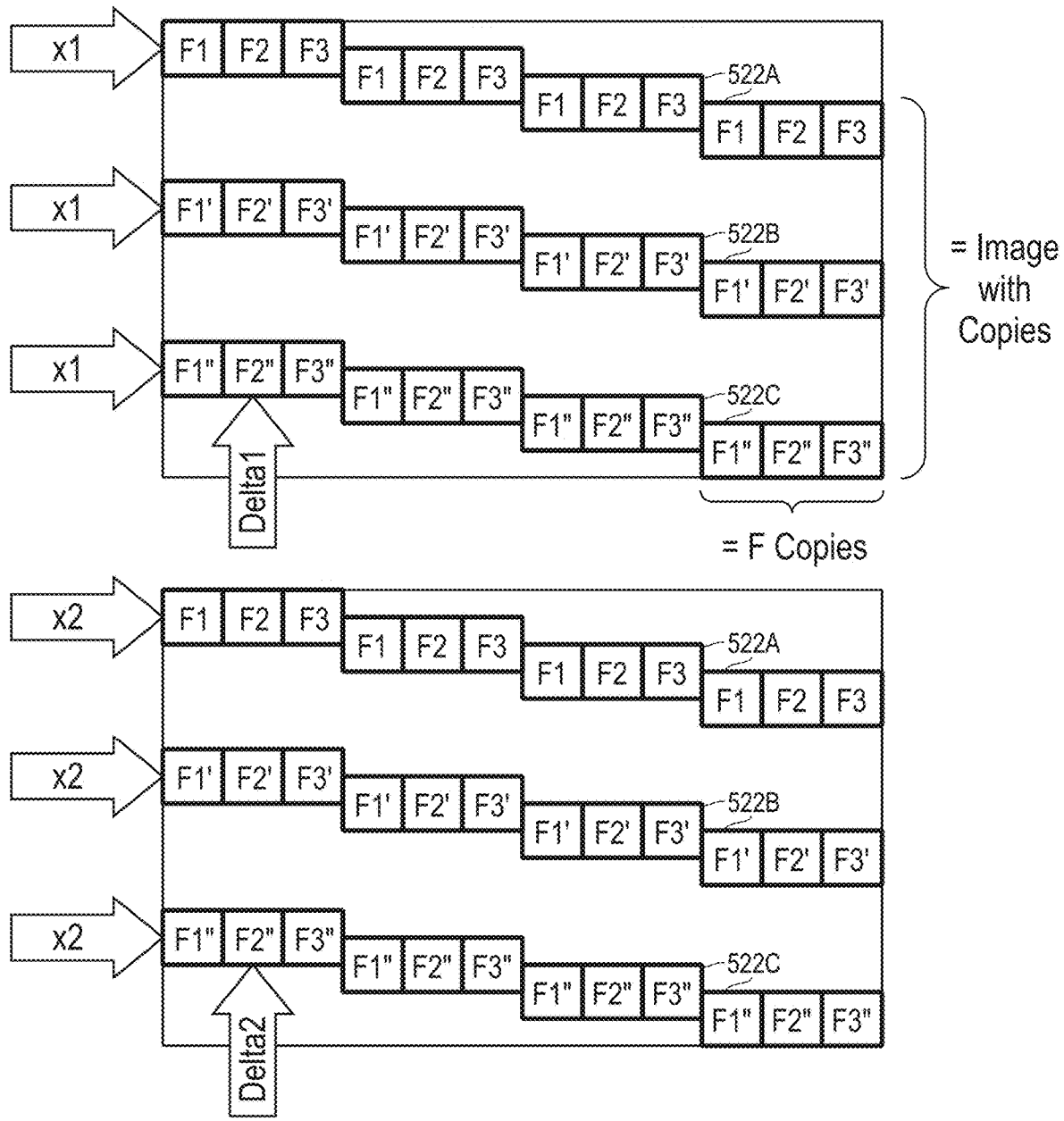
FIG. 17 depicts sequential in-situ weight updates in a CNN that is implemented using a crosspoint array according to one or more embodiments of the present invention.

The process is performed for k time-steps, where the error signal for the first computed value is reused and updated for each of the k rows. FIGS. _____ for each time-step are not shown to avoid redundancy for a person skilled in the art. Further, as shown in FIGS. 15-17, in each time-step, a new error signal is computed for each of the k rows. Each input row takes one (1) time step to generate and can immediately be sent to a previous layer. In other words, each computed value is broadcast across multiple rows (or columns) instead of just a single row (or column) to compute partial error signal in each layer.

FIG. 16 depicts a subsequent operation in the back propagation where the accumulated partial errors corresponding to each filter 522-526 are added and sent to a previous layer in the CNN. The accumulated error signal at each layer is used for a weight update for that layer.

Backpropagation of pooling layers can be handled at the support circuitry 712. For max pooling, the support circuitry 712 includes additional memory to store which neuron was the maximum during forward propagation. The total error signal for the entire error (delta) is sent to the maximum neuron only, and all other upstream neurons are sent a 0 (zero) in the case of max pooling being used for training the CNN. Alternatively, if the CNN uses average pooling, the error (delta) is split equally among all neurons during backpropagation. For example, for 2×2 pooling, ¼ of the final error signal value is sent to all upstream neurons.

Accordingly, the pipelining of values through the several layers in the CNN to compute the error signal values during back propagation can be performed in a similar manner as the pipelining in the forward propagation, but in a reverse direction.

The weight values in the CNN are subsequently updated using the error signal values computed during the back propagation. In one or more embodiments of the present invention, the weight updates are performed in-situ.

FIG. 17 depicts sequential in-situ weight updates in a CNN that is implemented using a crosspoint array according to one or more embodiments of the present invention. As depicted, in this case each pair of input and delta is serialized and input into the crosspoint array 705. Such serialization avoids unintended updates. The weight update is performed as: w1=w0+a(d−y)x, where w1=weight updated, w0=present weight, a=learning rate, d=desired output, y=actual output, and x=input. Here, a is a predetermined value. As can be noted, with the back propagation performed as described herein, no resets have to be performed and the weight synchronization occurs by default, i.e., the weights are updated in-place, and additional instructions to read and write weights are avoided. This improves efficiency of the system 700.

The system 705 sends all F copies of deltas serially to all copies of the kernels, so that the weights are synchronized. In this case, the number of update cycles required for each image=(image_width)$^2$.

Figure 18:
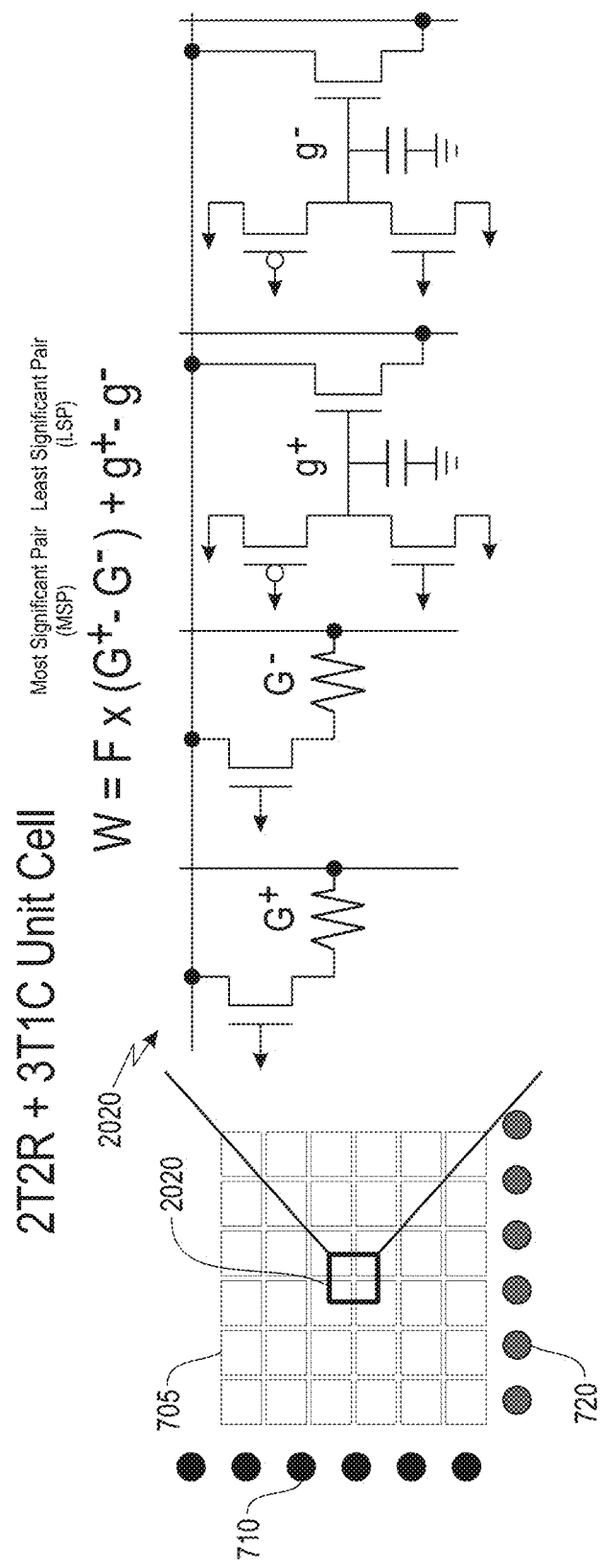
FIG. 18 depicts an example structure of a 2T2R+3T1C (2 transistor 2 resistor, and 3 transistor 1 capacitor) unit cell according to one or more embodiments of the present invention.

In one or more embodiments of the present invention, the crosspoint array 705 includes 2T2R+3T1C (2 transistor 2 resistor, and 3 transistor 1 capacitor) unit cells. FIG. 18 depicts an example structure of such a 2T2R+3T1C unit cell according to one or more embodiments of the present invention. In this case, the crosspoint array 705 includes a 2T2R+3T1C unit cell 2020 ("unit cell" hereinafter) at each crosspoint. The unit cell 2020 includes two cells, G+ and G−, which include 2 transistors and 2 resistors (2T2R) each. Further, the unit cell 2020 includes two cells, g+ and g−, which include 3 transistors and 1 capacitor (3T1C) each. The unit cell 2020 provides a weight value as $W = F \times (G^+ - G^-) + g^+ - g^-$, where F is a gain factor (e.g., F=3), $G^+$ and $G^-$ represent a conductance (resistance) of the resistors in the 2T2R cells, and $g^+$ and $g^-$ represent a capacitance of the capacitors of the 3T1C cells. During a weight update, only the $g^+$ is updated. The $g^-$ is shared with multiple columns in the crosspoint array 705 in one or more embodiments of the present invention. Further, in one or more embodiments of the present invention, weights are transferred from g+ to G+/G− every predetermined number of inputs (e.g., 8000 inputs).

Figure 19:
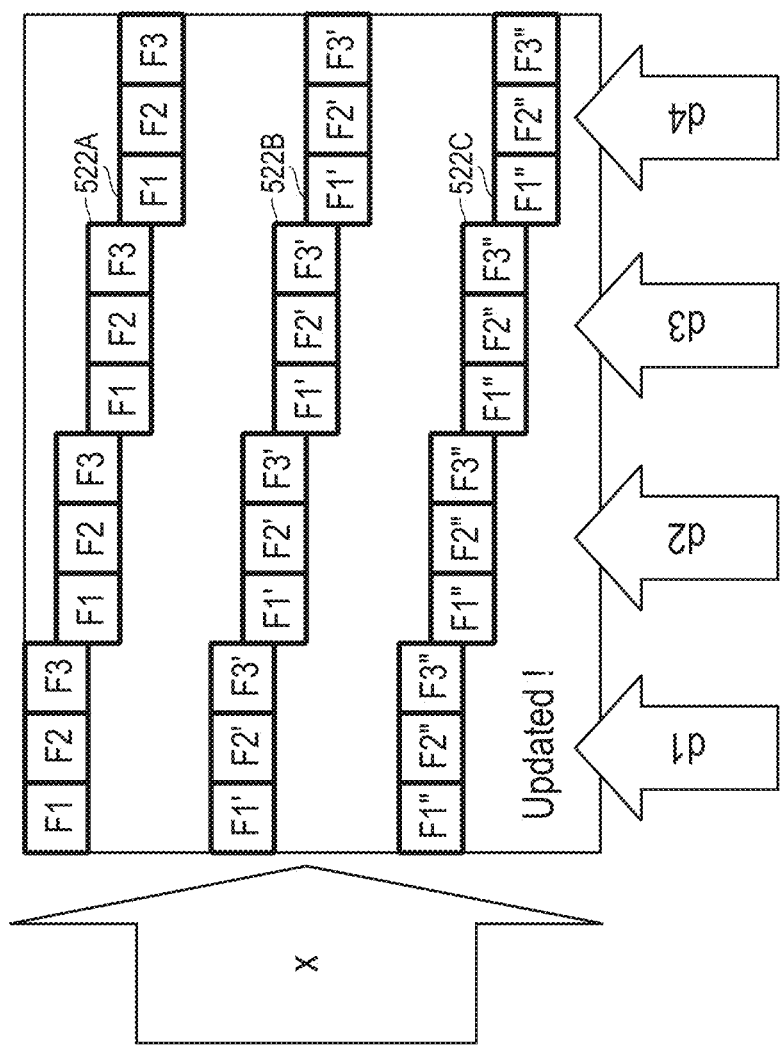
FIG. 19 depicts a weight update in a crosspoint array that includes 2T2R+3T1C (2 transistor 2 resistor, and 3 transistor 1 capacitor) unit cells according to one or more embodiments of the present invention.

FIG. 19 depicts a weight update in the crosspoint array that includes 2T2R+3T1C type unit cells according to one or more embodiments of the present invention. In these cases, with the crosspoint array 705 using unit cells 2020, the weight update can be performed by sending an entire row of input x and all delta values to the crosspoint array 705 for an update at once, i.e., substantially simultaneously. Here, for the weights to be synchronized the capacitance of $g^+$ cell is reset to 0 at each weight transfer. Accordingly, at every weight transfer step, the system 705 initializes the gate capacitor of 3T1C cell to 0V (or deeply OFF voltage) for unit cells 2020 of the crossbar 705 that are to remain at zero weight. During the weight transfer, even though update values can accumulate in unintended unit cells 2020, the read out transistor gate voltage of $g^+$ cell remains low between each transfer period, and hence, does not contribute to forward or reverse read current. Such resets can require additional time for synchronization because once every minibatch, the system 705 has to average and reprogram "image_width" number of copies of the weights. Even with that extra time, the weight update is faster than existing solutions because of the in-memory weight update with the error value being back propagated as described herein. Further, read and write operations of majority of the weights are avoided and only those weights that have to be reprogrammed are reset. In this case, the number of update cycles needed for each image is 1.

In yet other embodiments of the present invention, a mixed precision update of the weights is performed by storing the input (x) and the delta (d) in external memory. Here, the support circuitry 712, 722 include digital circuits that compute and accumulate weight updates.

Figure 20:
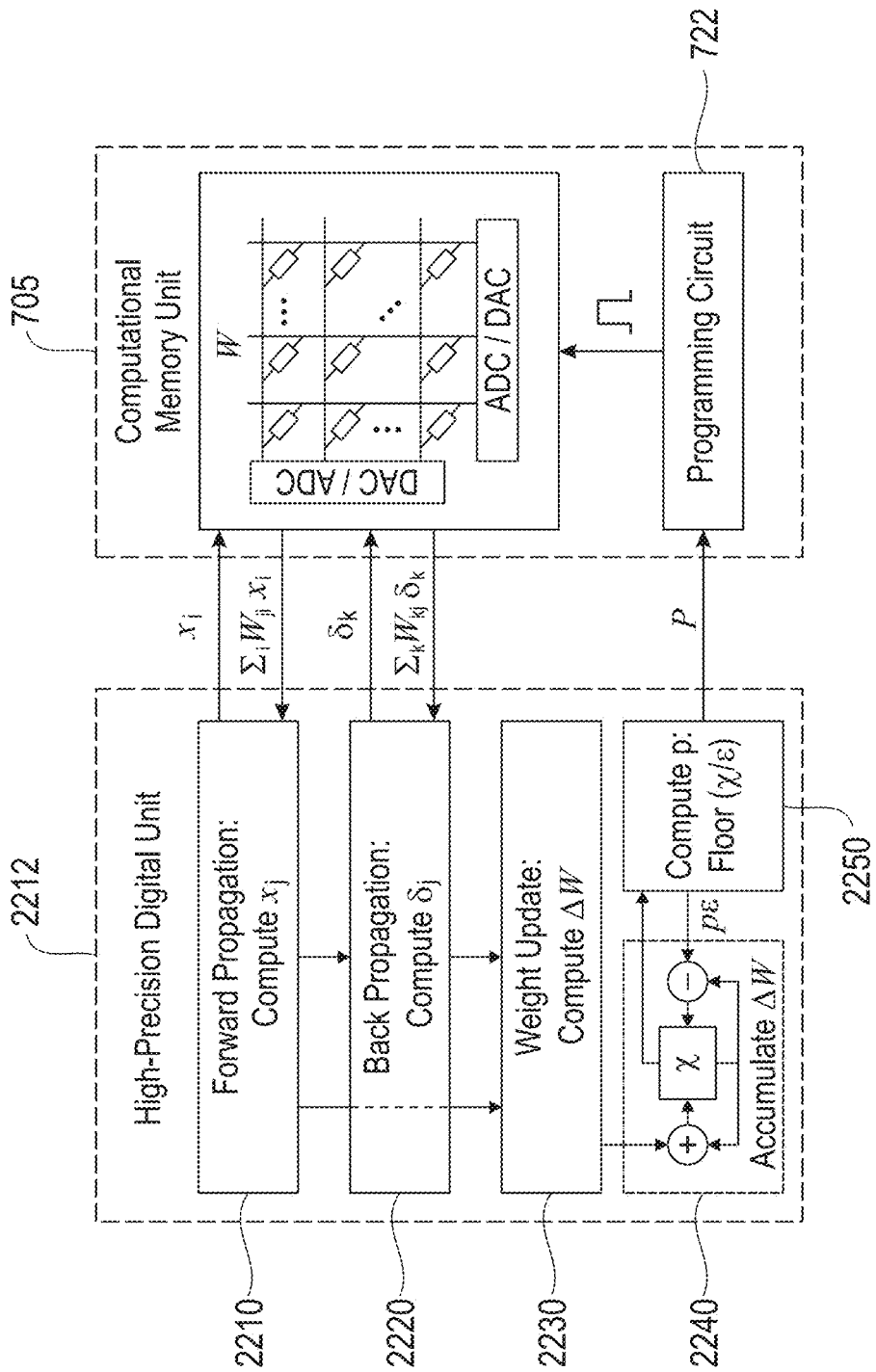
FIG. 20 depicts a block diagram and a data flow diagram for performing a weight update according to one or more embodiments of the present invention.
Figure 21:
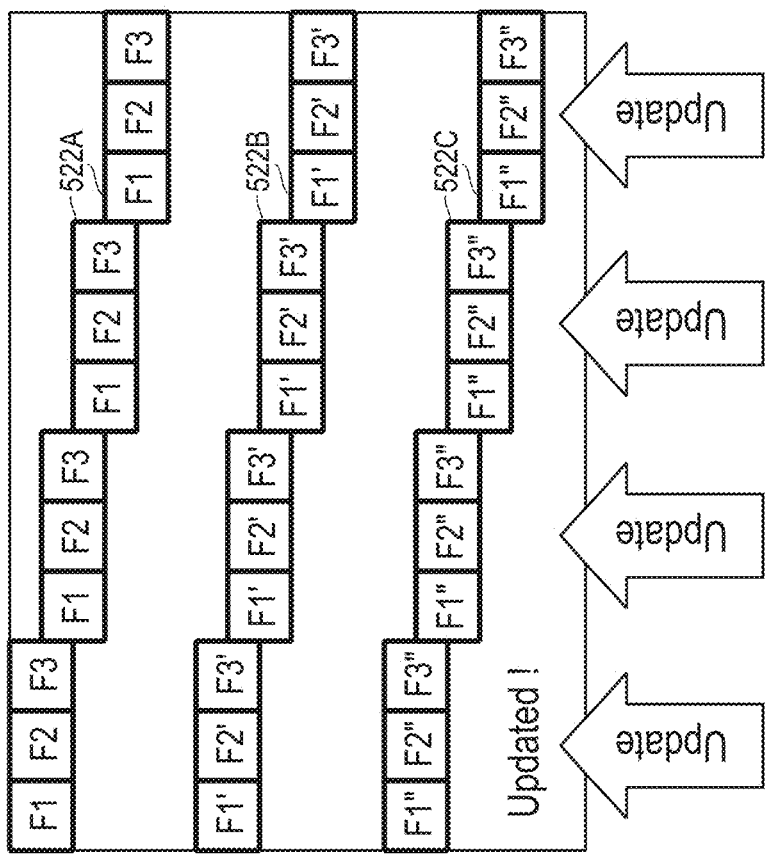
FIG. 21 depicts a mixed precision update of weight in a CNN that is implemented using a crosspoint array according to one or more embodiments of the present invention.

FIG. 20 depicts a block diagram and a data flow diagram for performing a weight update according to one or more embodiments of the present invention. The support circuit 712 includes a high precision digital unit 2212. The digital unit 2212 can transfer data with the crosspoint array 705 and the support circuit 722. The support circuit 722 can program the crosspoint array 705. The digital unit 2212 stores the input values (x) and computes the weight updates, at blocks 2210, 2220, and 2230. The weights are computed by receiving the delta values from the crosspoint array 705 that are received during the back propagation as described herein. The weights are accumulated over each update, at block 2240. If the accumulated weight exceeds a predetermined threshold, a pulse p is computed, at block 2250. The pulse is forwarded to the crosspoint array 705 to update all of the weights in the crosspoint array 705, as shown in FIG. 21.

The update pulses are applied column by column (or row by row) only when the accumulated weight update exceeds the predetermined threshold. In one or more embodiments of the present invention, unlike in the existing techniques, the weight updates are applied to all weight copies.

In this case, the number of update cycles per input is statistically dependent on the threshold value. In one or more embodiments of the present invention, the threshold is an array width (e.g., 512, 256) if all the columns are to be updated.

In this manner, embodiments of the present invention facilitate row-by-row mapping for training workload with improved peripheral circuitry for reverse/backward propagation of the computed error.

The present technical solutions may be a system, a method, and/or a computer program product at any possible technical detail level of integration. The computer program product may include a computer readable storage medium (or media) having computer readable program instructions thereon for causing a processor to carry out aspects of the present technical solutions.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present technical solutions may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present technical solutions.

Aspects of the present technical solutions are described herein with reference to flowchart illustrations and/or block diagrams of methods, apparatus (systems), and computer program products according to embodiments of the technical solutions. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present technical solutions. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are to be construed in the broadest sense, superseding any other implied definitions hereinbefore or hereinafter unless expressly asserted to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

It will also be appreciated that any module, unit, component, server, computer, terminal or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Such computer storage media may be part of the device or accessible or connectable thereto. Any application or module herein described may be implemented using computer readable/executable instructions that may be stored or otherwise held by such computer readable media.

The descriptions of the various embodiments of the technical features herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer implemented method for implementing a convolutional neural network (CNN) using a crosspoint array, the method comprising:
configuring the crosspoint array, the crosspoint array corresponding to a convolution layer in the CNN, by storing one or more weights in crosspoint devices of the crosspoint array; and
training the CNN, wherein the training comprises:
mapping input data of the convolution layer into the crosspoint array in a row-by-row manner;
inputting excitation data in a row-by-row manner into the crosspoint array, thereby creating row-by-row forward output from the crosspoint array;
computing outputs from the crosspoint devices and storing the outputs in corresponding integrators;
computing errors in the outputs as compared to desired outputs, wherein the errors correspond to multiple rows; and
back propagating the computed errors in a row-by-row manner into the crosspoint array, the computed errors transmitted to a previous convolution layer.

2. The computer implemented method of claim 1, wherein the integrators include capacitors.

3. The computer implemented method of claim 1, wherein an output electric current is generated by a crosspoint device that is at an intersection of a first row wire and a first column wire of the crosspoint array, and an integrator corresponds to a second column wire of the crosspoint array.

4. The computer implemented method of claim 1, wherein the training further comprises updating the copies of the weights.

5. The computer implemented method of claim 4, wherein updating the copies of the weights comprises updating each weight sequentially.

6. The computer implemented method of claim 4, wherein updating the copies of the weights comprises fixing a subset of the weights to zero.

7. The computer implemented method of claim 4, wherein updating the copies of the weights comprises:
digitizing both the forward input and the errors that are back propagated;
computing an update, the value of the update being accumulated over multiple excitations; and
triggering an analog update event to the crosspoint array, in response to a threshold of the update being exceeded.

8. The computer implemented method of claim 1, wherein the crosspoint devices are arranged to implement one or more rows of convolution kernels of a given convolution layer of the CNN, and wherein the input data represent neuron excitations to the said given convolution layer of the CNN presented one column at a time.

9. The computer implemented method of claim 1, wherein the crosspoint devices are memory cells, each of which include 3 transistors and 1 capacitor.

10. An electronic circuit for performing computations of a trained convolutional neural network (CNN), the electronic circuit comprising:
a crosspoint array; and
an output circuit comprising one or more integrators;
wherein performing a training of the CNN comprises performing a method that comprises:
configuring the crosspoint array, the crosspoint array corresponding to a convolution layer in the CNN, by storing one or more weights in crosspoint devices of the crosspoint array;
mapping input data of the convolution layer into the crosspoint array in a row-by-row manner;
inputting excitation data in a row-by-row manner into the crosspoint array, thereby creating row-by-row forward output from the crosspoint array;
computing outputs from the crosspoint devices and storing the outputs in corresponding integrators;
computing errors in the outputs as compared to desired outputs, wherein the errors correspond to multiple rows; and
back propagating the computed errors in a row-by-row manner into the crosspoint array, the computed errors transmitted to a previous convolution layer.

11. The electronic circuit of claim 10, wherein the integrators include capacitors.

12. The electronic circuit of claim 10, wherein an output electric current is generated by a crosspoint device that is at an intersection of a first row wire and a first column wire of the crosspoint array, and an integrator corresponds to a second column wire of the crosspoint array.

13. The electronic circuit of claim 10, wherein the training further comprises updating copies of the weights.

14. The electronic circuit of claim 13, wherein updating the copies of the weights comprises updating each weight sequentially.

15. The electronic circuit of claim 13, wherein updating the copies of the weights comprises fixing a subset of the weights to zero.

16. The electronic circuit of claim 13, wherein updating the copies of the weights comprises:
digitizing both, the forward input and the errors that are back propagated;
computing an update, the value of the update being accumulated over multiple excitations; and
triggering an analog update event to the crosspoint array, in response to a threshold of the update being exceeded.

17. The electronic circuit of claim 10, wherein the crosspoint devices are arranged to implement one or more rows of convolution kernels of a given convolution layer of the CNN, and wherein the input data represents neuron excitations to the said given convolution layer of the CNN presented one column at a time.

18. The electronic circuit of claim 10, wherein the crosspoint devices are memory cells, each of which include 3 transistors and 1 capacitor.

19. A system comprising:
a controller; and
a crossbar system coupled with the controller, the crossbar system configured to perform computations of a trained convolutional neural network (CNN), the crossbar system comprising:
a crosspoint array; and
an output circuit comprising one or more integrators;
wherein performing a training of the CNN comprises performing a method that comprises:
configuring the crosspoint array, which corresponds to a convolution layer in the CNN, by storing one or more weights in crosspoint devices of the crosspoint array;
mapping input data of the convolution layer into the crosspoint array in a row-by-row manner;
inputting excitation data in a row-by-row manner into the crosspoint array, thereby creating row-by-row forward output from the crosspoint array;
computing outputs from the crosspoint devices and storing the outputs in corresponding integrators;

computing errors in the outputs as compared to desired outputs, wherein the errors correspond to multiple rows; and back propagating the computed errors in a row-by-row manner into the crosspoint array, the computed errors transmitted to a previous convolution layer.

20. The system of claim 19, wherein the training further comprises updating copies of the weights.

21. The system of claim 20, wherein updating the copies of the weights comprises updating each weight sequentially.

22. The system of claim 20, wherein updating the copies of the weights comprises fixing a subset of the weights to zero.

23. The system of claim 20, wherein updating the copies of the weights comprises:

digitizing both, the forward input and the errors that are back propagated;

computing an update, the value of the update being accumulated over multiple excitations; and triggering an analog update event to the crosspoint array, in response to a threshold of the update being exceeded.

24. The system of claim 19, wherein the crosspoint devices are arranged to implement one or more rows of the convolution kernels of a given convolution layer of the CNN, and wherein the input data represents neuron excitations to the said given convolution layer of the CNN presented one column at a time.

25. The system of claim 19, wherein the crosspoint devices are memory cells, each of which include 3 transistors and 1 capacitor.

26. A computer-implemented method for implementing a convolutional neural network (CNN) using a crosspoint array, the method comprising:

configuring the crosspoint array, the crosspoint array corresponding to a first convolution layer in the CNN, by storing one or more weights in crosspoint devices of the crosspoint array; and training the CNN, wherein the training comprises:

mapping input data of the first convolution layer into the crosspoint array in a row-by-row manner;

performing forward propagation, which comprises:

computing outputs from the crosspoint devices and storing the outputs in corresponding integrators; and sending the outputs to a second convolution layer of the CNN, the second convolution layer being sequentially after the first convolution layer in the CNN;

performing backward propagation, which comprises:

computing errors in the outputs as compared to desired outputs; and back propagating the computed errors in a row-by-row manner into the crosspoint array, the computed errors transmitted to a third convolution layer of the CNN, the third convolution layer being sequentially prior to the first convolution layer; and performing weight update, which comprises:

receiving back propagated computed errors from the second convolution layer; and adjusting the weights stored in the crosspoint devices using the computed errors from the second convolution layer.

27. The computer implemented method of claim 26, wherein an output electric current is generated by a crosspoint device that is at an intersection of a first row wire and a first column wire of the crosspoint array, and an integrator corresponds to a second column wire of the crosspoint array.

28. The computer implemented method of claim 26, wherein updating copies of the weights comprises updating each weight sequentially.

29. The computer implemented method of claim 26, wherein updating the copies of the weights comprises fixing a subset of the weights to zero.

* * * * *